(12) United States Patent
Zhu et al.

(10) Patent No.: US 11,522,115 B2
(45) Date of Patent: Dec. 6, 2022

(54) IMPEDANCE MATCHED SUPERCONDUCTING NANOWIRE PHOTODETECTOR FOR SINGLE- AND MULTI-PHOTON DETECTION

(71) Applicants: Massachusetts Institute of Technology, Cambridge, MA (US); California Institute of Technology, Pasadena, CA (US)

(72) Inventors: Di Zhu, Cambridge, MA (US); Marco Colangelo, Cambridge, MA (US); Boris Korzh, Altadena, CA (US); Matthew Shaw, Los Angeles, CA (US); Karl K. Berggren, Arlington, MA (US)

(73) Assignees: Massachusetts Institute of Technology, Cambridge, MA (US); California Institute of Technology, Pasadena, CA (US)

( * ) Notice: Subject to any disclaimer, the term of this patent is extended or adjusted under 35 U.S.C. 154(b) by 288 days.

(21) Appl. No.: 16/808,904

(22) Filed: Mar. 4, 2020

(65) Prior Publication Data
US 2021/0119102 A1    Apr. 22, 2021

Related U.S. Application Data

(60) Provisional application No. 62/923,105, filed on Oct. 18, 2019.

(51) Int. Cl.
*H01L 39/10* (2006.01)
*H01L 39/08* (2006.01)
*G01J 1/44* (2006.01)

(52) U.S. Cl.
CPC ............... *H01L 39/10* (2013.01); *G01J 1/44* (2013.01); *H01L 39/08* (2013.01)

(58) Field of Classification Search
CPC ............. H01L 39/10; H01L 39/08; G01J 1/44
See application file for complete search history.

(56) References Cited

U.S. PATENT DOCUMENTS

| 8,761,848 B2 | 6/2014 | Berggren et al. |
| 9,240,539 B2 | 1/2016 | Nam et al. |

(Continued)

FOREIGN PATENT DOCUMENTS

EP    3217336 A1    9/2017

OTHER PUBLICATIONS

Annunziata et al., "Reset dynamics and latching in niobium superconducting nanowire single-photon detectors." Journal of Applied Physics 108.8 (2010): 084507. 8 pages.

(Continued)

*Primary Examiner* — Georgia Y Epps
*Assistant Examiner* — Don J Williams
(74) *Attorney, Agent, or Firm* — Smith Baluch LLP

(57) ABSTRACT

Conventional readout of a superconducting nanowire single-photon detector (SNSPD) sets an upper bound on the output voltage to be the product of the bias current and the load impedance, $I_B \times Z_{load}$, where $Z_{load}$ is limited to 50Ω in standard RF electronics. This limit is broken/exceeded by interfacing the 50Ω load and the SNSPD using an integrated superconducting transmission line taper. The taper is a transformer that effectively loads the SNSPD with high impedance without latching. The taper increases the amplitude of the detector output while preserving the fast rising edge. Using a taper with a starting width of 500 nm, a 3.6× higher pulse amplitude, 3.7× faster slew rate, and 25.1 ps smaller timing jitter was observed. The taper also makes the detector's output voltage sensitive to the number of photon-induced hotspots and enables photon number resolution.

18 Claims, 24 Drawing Sheets
(21 of 24 Drawing Sheet(s) Filed in Color)

(56) References Cited

U.S. PATENT DOCUMENTS

| | | |
|---|---|---|
| 9,520,180 B1 | 12/2016 | Mukhanov et al. |
| 2013/0187051 A1 | 7/2013 | McCaughan et al. |
| 2018/0145110 A1 | 5/2018 | Zhao et al. |

OTHER PUBLICATIONS

Bardin et al., "Cryogenic SiGe integrated circuits for superconducting nanowire single photon detector readout." Advanced Photon Counting Techniques VIII. vol. 9114. International Society for Optics and Photonics, 2014. 9 pages.

Bell et al., "Photon number-resolved detection with sequentially connected nanowires." IEEE Transactions on Applied Superconductivity 17.2 (2007): 289-292.

Bellei et al., "Free-space-coupled superconducting nanowire single-photon detectors for infrared optical communications." Optics express 24.4 (2016): 3248-3257.

Berggren et al., "A superconducting nanowire can be modeled by using SPICE." Superconductor Science and Technology 31.5 (2018): 055010. 13 pages.

Brassard et al., "Limitations on practical quantum cryptography." Physical Review Letters 85.6 (2000): 1330. 4 pages.

Cahall et al., "Multi-photon detection using a conventional superconducting nanowire single-photon detector." Optica 4.12 (2017): 1534-1535.

Cahall et al., "Scalable cryogenic readout circuit for a superconducting nanowire single-photon detector system." Review of Scientific Instruments 89.6 (2018): 063117. 8 pages.

Chen et al., "Efficient generation and characterization of spectrally factorable biphotons." Optics express 25.7 (2017): 7300-7312.

Chen et al., "Indistinguishable single-mode photons from spectrally engineered biphotons." Optics express 27.8 (2019): 11626-11634.

Cheng et al., "Superconducting nanowire single-photon detectors integrated with current reservoirs." CLEO: Science and Innovations. Optical Society of America, 2017. 2 pages.

Clem et al., "Geometry-dependent critical currents in superconducting nanocircuits." Physical Review B 84.17 (2011): 174510. 27 pages.

Crespi et al., "Anderson localization of entangled photons in an integrated quantum walk." Nature Photonics 7.4 (2013): 322. 7 pages.

Dane et al., "Bias sputtered NbN and superconducting nanowire devices." Applied Physics Letters 111.12 (2017): 122601. 6 pages.

Dauler et al., "Photon-number-resolution with sub-30-ps timing using multi-element superconducting nanowire single photon detectors." Journal of Modern Optics 56.2-3 (2009): 364-373.

Day et al., "A broadband superconducting detector suitable for use in large arrays." Nature 425.6960 (2003): 817. 5 pages.

Di Giuseppe et al., "Direct observation of photon pairs at a single output port of a beam-splitter interferometer." Physical Review A 68.6 (2003): 063817. 4 pages.

Divochiy et al., "Superconducting nanowire photon-number-resolving detector at telecommunication wavelengths." Nature Photonics 2.5 (2008): 302.6 pages.

Ejrnaes et al., "A cascade switching superconducting single photon detector." Applied Physics Letters 91.26 (2007): 262509. 4 pages.

Fitch et al., "Photon-number resolution using time-multiplexed single-photon detectors." Physical Review A 68.4 (2003): 043814. 6 pages.

Gansen et al., "Photon-number-discriminating detection using a quantum-dot, optically gated, field-effect transistor." Nature Photonics 1.10 (2007): 585. 4 pages.

Gerrits et al., "Spectral correlation measurements at the Hong-Ou-Mandel interference dip." Physical Review A 91.1 (2015): 013830. 7 pages.

Grein et al., "An optical receiver for the lunar laser communication demonstration based on photon-counting superconducting nanowires." Advanced Photon Counting Techniques IX. vol. 9492. international Society for Optics and Photonics, 2015. 7 pages.

Hadfield, "Single-photon detectors for optical quantum information applications." Nature photonics 3.12 (2009): 696. 10 pages.

Hong et al., "Measurement of subpicosecond time intervals between two photons by interference." Physical review letters 59.18 (1987): 2044. 3 pages.

International Search Report and Written Opinion in International Application No. PCT/US2020/020944 dated Jun. 1, 2020, 15 pages.

Jahanmirinejad et al., "Photon-number resolving detector based on a series array of superconducting nanowires." Applied Physics Letters 101.7 (2012): 072602. 5 pages.

Jahanmirinejad et al., "Proposal for a superconducting photon number resolving detector with large dynamic range." Optics express 20.5 (2012): 5017-5028.

Jiang et al., "Photon-number-resolving detector with 10 bits of resolution." Physical Review A 75.6 (2007): 062325. 5 pages.

Kahl et al., "Spectrally multiplexed single-photon detection with hybrid superconducting nanophotonic circuits." Optica 4.5 (2017): 557-562.

Kahl et al., "Spectrally resolved single-photon imaging with hybrid superconducting-nanophotonic circuits." arXiv preprint arXiv:1609.07857 (2016). 20 pages.

Kerman et al., "Electrothermal feedback in superconducting nanowire single-photon detectors." Physical review B 79.10 (2009): 100509. 4 pages.

Kerman et al., "Kinetic-inductance-limited reset time of superconducting nanowire photon counters." Applied physics letters 88.11 (2006): 111116. 4 pages.

Kitaygorsky et al., "HEMT-based readout technique for dark-and photon-count studies in NbN superconducting single-photon detectors." IEEE Transactions on Applied Superconductivity 19.3 (2009): 346-349.

Klopfenstein, "A transmission line taper of improved design." Proceedings of the IRE 44.1 (1956): 31-35.

Kok et al., "Linear optical quantum computing with photonic qubits." Reviews of Modern Physics 79.1 (2007): 135. 40 pages.

Korzh et al., "Demonstrating sub-3 ps temporal resolution in a superconducting nanowire single-photon detector." arXiv preprint arXiv: 1804.06839 (2018). 14 pages.

Korzh et al., "WSi superconducting nanowire single photon detector with a temporal resolution below 5 ps." CLEO: QELS_Fundamental Science. Optical Society of America, 2018. 3 pages.

Lita et al., "Counting near-infrared single-photons with 95% efficiency." Optics express 16.5 (2008): 3032-3040.

LNA-2500 Datasheet. RF Bay, Inc. Accessed at http://rfcayinc.com/products_pdf/product_107.pdf on Apr. 28, 2020. 3 pages.

Lo et al., "Decoy state quantum key distribution." Physical review letters 94.23 (2005): 230504. 4 pages.

Mani et al., "A single-stage cryogenic LNA with low power consumption using a commercial SiGe HBT." 2014 11th International Workshop on Low Temperature Electronics (WOLTE). IEEE, 2014. 4 pages.

Marsili et al., "Detecting single infrared photons with 93% system efficiency." Nature Photonics 7.3 (2013): 210. 5 pages.

Marsili et al., "Efficient single photon detection from 500 nm to 5 μm wavelength." Nano letters 12.9 (2012): 4799-4804.

Mason et al., "Slow-Wave Structures Utilizing Superconducting Thin-Film Transmission Lines." Journal of Applied Physics 40.5 (1969): 2039-2051.

McCaughan et al., "A superconducting-nanowire three-terminal electrothermal device." Nano letters 14.10 (2014): 5748-5753.

Miller et al., "Compact cryogenic self-aligning fiber-to-detector coupling with losses below one percent." Optics express 19.10 (2011): 9102-9110.

Najafi et al., "Timing performance of 30-nm-wide superconducting nanowire avalanche photodetectors." Applied Physics Letters 100.15 (2012): 152602. 5 pages.

Natarajan et al., "Superconducting nanowire single-photon detectors: physics and applications." Superconductor science and technology 25.6 (2012): 063001. 17 pages.

Nicolich et al., "Universal Model for the Turn-On Dynamics of Superconducting Nanowire Single-Photon Detectors." Physical Review Applied Phys Rev Applied 12 (2019): 034020. 12 pages.

(56) References Cited

OTHER PUBLICATIONS

Ortlepp et al., "Demonstration of digital readout circuit for superconducting nanowire single photon detector." Optics Express 19.19 (2011): 18593-18601.
Peruzzo et al., "Quantum walks of correlated photons." Science 329.5998 (2010): 1500-1503.
Qiang et al., "Large-scale silicon quantum photonics implementing arbitrary two-qubit processing." Nature photonics 12.9 (2018): 534. 23 pages.
Rosfjord et al., "Nanowire single-photon detector with an integrated optical cavity and anti-reflection coating." Optics Express 14.2 (2006): 527-534.
Sahin et al., "Waveguide photon-number-resolving detectors for quantum photonic integrated circuits." Applied Physics Letters 103.11 (2013): 111116. 6 pages.
Santavicca et al., "Microwave dynamics of high aspect ratio superconducting nanowires studied using self-resonance." Journal of Applied Physics 119.23 (2016): 234302. 9 pages.
Swihart, "Field solution for a thin-film superconducting strip transmission line." Journal of Applied Physics 32.3 (1961): 461-469.
Terai et al., "Demonstration of single-flux-quantum readout operation for superconducting single-photon detectors." Applied Physics Letters 97.11 (2010): 112510. 4 pages.
Trivelpiece et al., "Space charge waves in cylindrical plasma columns." Journal of Applied Physics 30.11 (1959): 1784-1793.
Vetter et al., "Cavity-enhanced and ultrafast superconducting single-photon detectors." Nano letters 16.11 (2016): 7085-7092.
Waks et al., "Generation of photon number states." New Journal of Physics 8.1 (2006): 4. 9 pages.
Waks et al., "High-efficiency photon-number detection for quantum information processing." IEEE Journal of selected topics in quantum electronics 9.6 (2003): 1502-1511.
Wan et al., "High input impedance cryogenic RF amplifier for series nanowire detector." IEEE Transactions on Applied Superconductivity 27.4 (2017): 1-5.
Wollman et al., "UV superconducting nanowire single-photon detectors with high efficiency, low noise, and 4 K operating temperature." Optics express 25.22 (2017): 26792-26801.
Wu et al., "Improving the timing jitter of a superconducting nanowire single-photon detection system." Applied optics 56.8 (2017): 2195-2200.
Yang et al., "Modeling the electrical and thermal response of superconducting nanowire single-photon detectors." IEEE transactions on applied superconductivity 17.2 (2007): 581-585.
Yin et al., "Measurement-device-independent quantum key distribution over a 404 km optical fiber." Physical review letters 117.19 (2016): 190501. 5 pages.
Yoshida et al., "Modeling of kinetic-inductance coplanar striplin with NbN thin films." Japanese journal of applied physics 31.12R (1992): 3844. 8 pages.
Zhao et al., "A distributed electrical model for superconducting nanowire single photon detectors." Applied Physics Letters 113.8 (2018): 082601. 6 pages.
Zhao et al., "Intrinsic timing jitter of superconducting nanowire single-photon detectors." Applied Physics B 104.3 (2011): 673-678.
Zhao et al., "Single-photon imager based on a superconducting nanowire delay line." Nature Photonics 11.4 (2017): 247. 7 pages.
Zhou et al., "Few-photon imaging at 1550 nm using a low-timing-jitter superconducting nanowire single-photon detector." Optics express 23.11 (2015): 14603-14611.
Zhu et al., "A scalable multi-photon coincidence detector based on superconducting nanowires." Nature nanotechnology 13.7 (2018): 596. 16 pages.
Zhu et al., "Superconducting nanowire single-photon detector with integrated impedance-matching taper." Applied Physics Letters 114.4 (2019): 042601. 9 pages.
Zhu et al., "Superconducting nanowire single-photon detector with integrated impedance-matching taper." Applied Physics Letters 114.4 (2019): 042601, 11 pages.

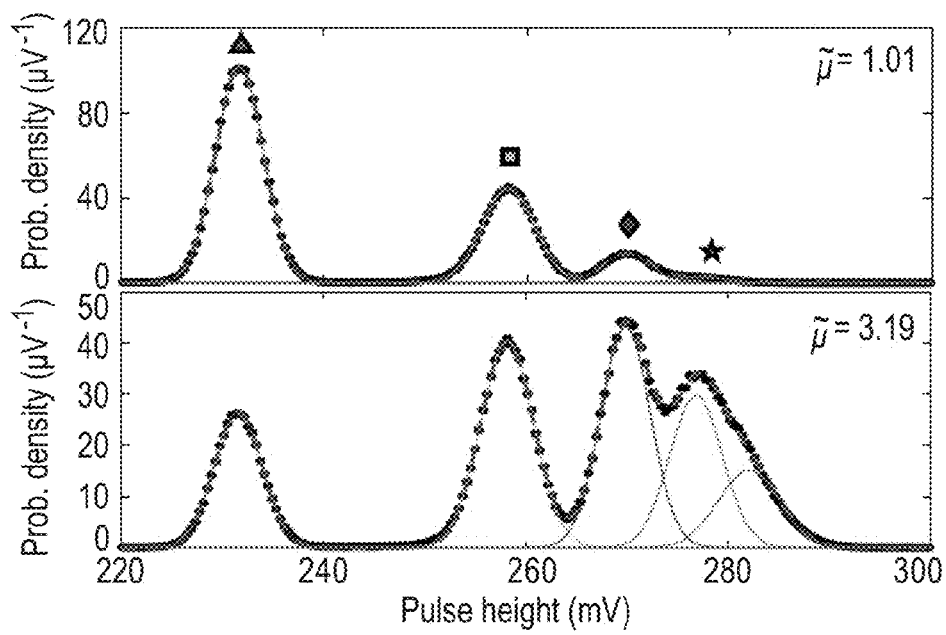
FIG. 13A
FIG. 13B
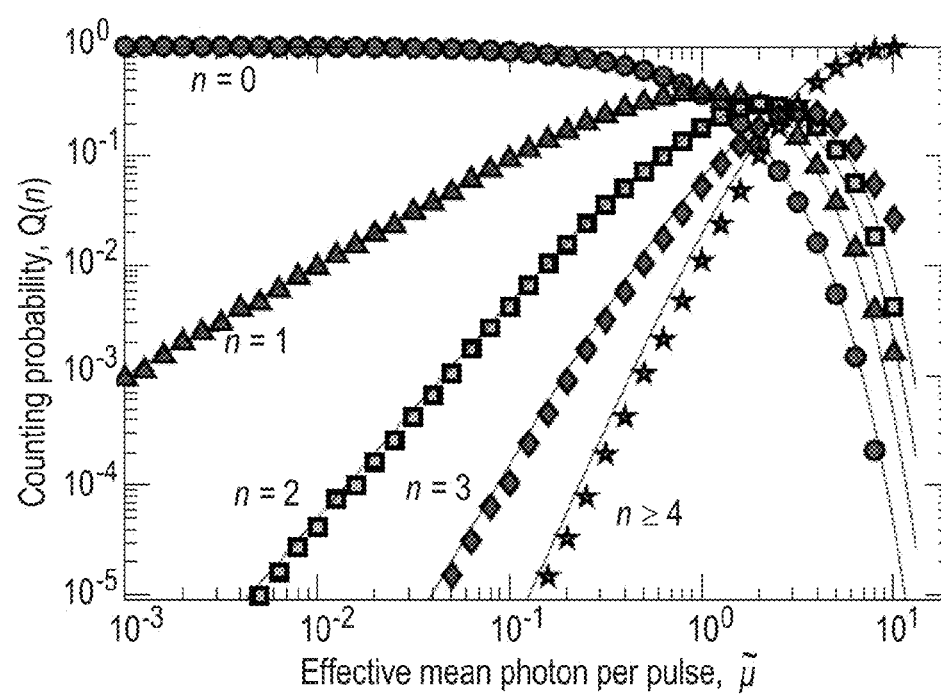
FIG. 13C

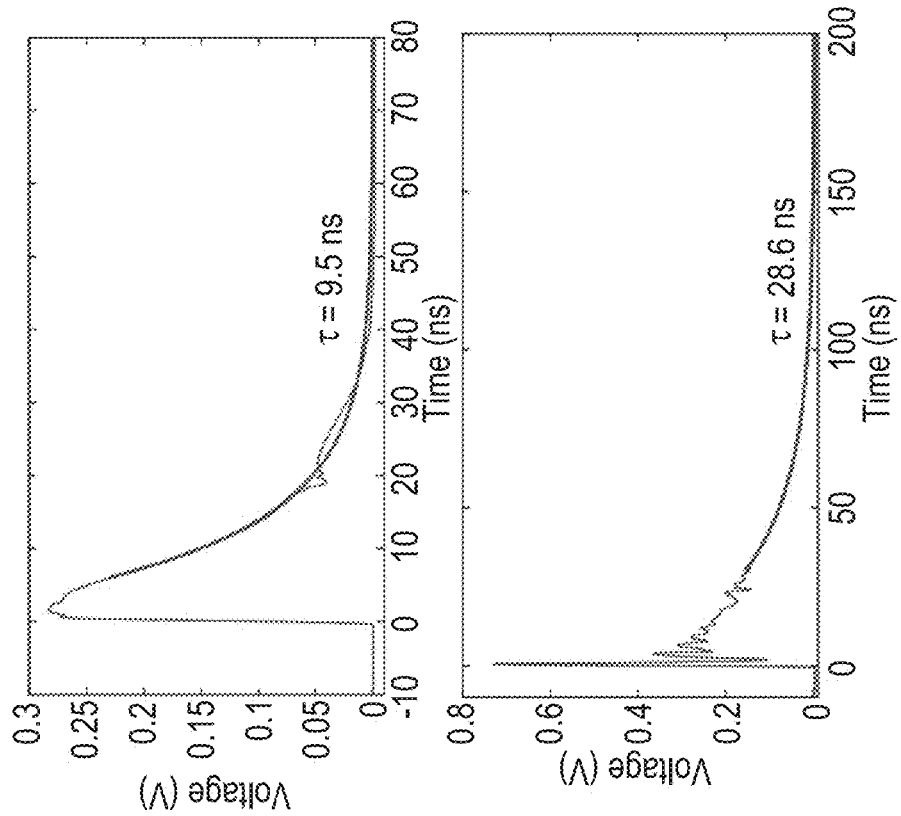
FIG. 28A
FIG. 28B
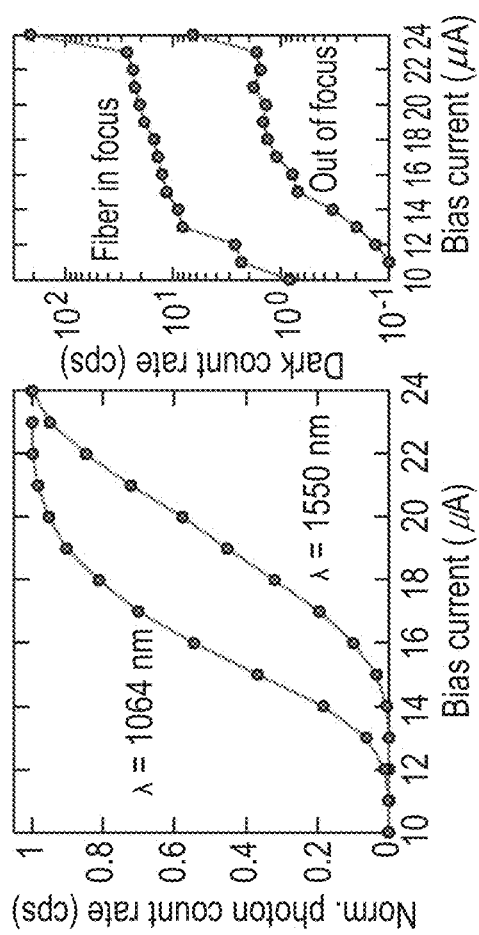
FIG. 27B
FIG. 27A

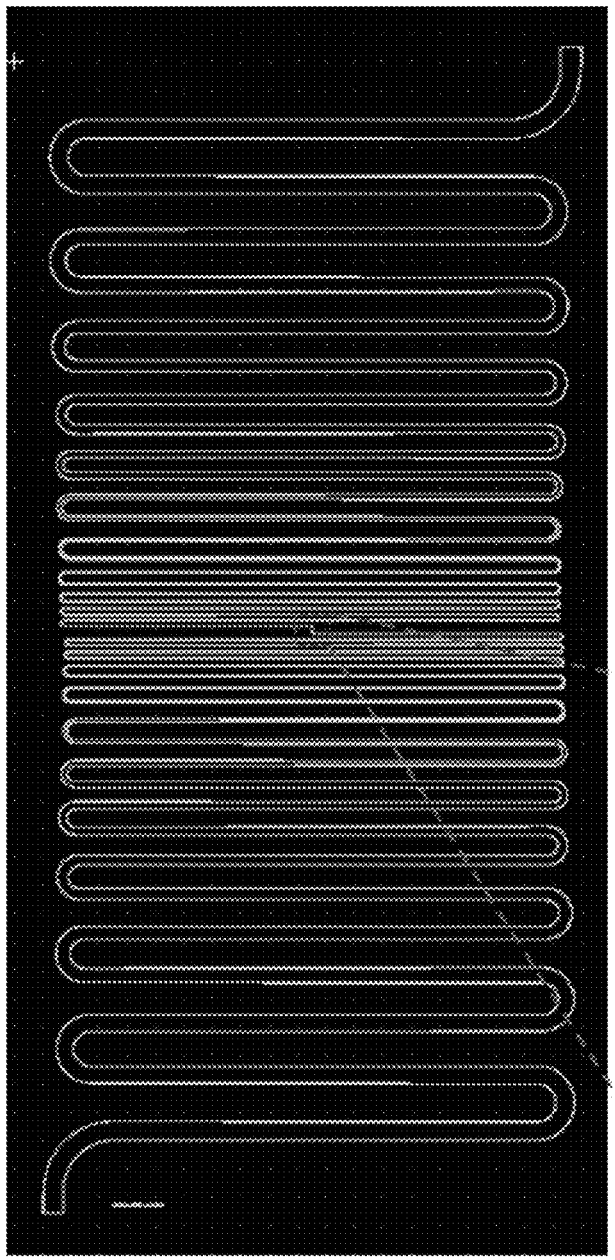
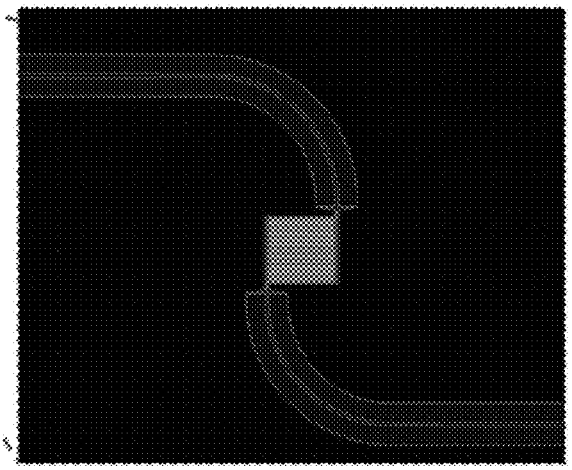
FIG. 31

IMPEDANCE MATCHED SUPERCONDUCTING NANOWIRE PHOTODETECTOR FOR SINGLE- AND MULTI-PHOTON DETECTION

CROSS-REFERENCE TO RELATED APPLICATION(S)

This application claims priority, under 35 U.S.C. § 119(e), to U.S. Application No. 62/923,105, filed Oct. 18, 2019, which is incorporated herein by reference in its entirety.

GOVERNMENT SUPPORT STATEMENT

This invention was made with Government support under Grant No. ECCS1509486 awarded by the National Science Foundation, Grant No. W911NF-16-2-0192 awarded by the Army Research Office (ARO), and Grant No. 80NM0018D004 awarded by the National Aeronautics and Space Administration's Jet Propulsion Laboratory. The Government has certain rights in the invention.

BACKGROUND

The superconducting nanowire single-photon detector (SNSPD) is the leading single-photon detection technology at infrared wavelengths. With exceptional performance, it has played an essential role in various applications, especially quantum information science and deep-space optical communication.

A common problem with SNSPDs is their low output voltage and signal-to-noise ratio (SNR), which has been a limiting factor in detector timing jitter. A simple lumped-circuit model suggests that the output voltage from the nanowire in an SNSPD cannot exceed $I_B \times Z_{load}$, where $I_B$ is the bias current and $Z_{load}$ is the load impedance. $I_B$ is limited by the nanowire's switching current at the μA range. $Z_{load}$ is set by the input impedance of the coaxial cable and RF electronics, which is conventionally 50Ω. To improve readout SNR, significant progress has been made in developing cryogenic amplifiers with low noise, dissipation, and cost, e.g., using silicon germanium (SiGe) and gallium arsenide (GaAs) transistors. Digital readout circuits built directly from superconducting electronics, such as nanocryotrons and single flux quantum (SFQ) circuits, have also been demonstrated. These integrated superconducting circuits are low-noise and scalable, but usually require additional biasing and suffer from leakage current and crosstalk.

An alternative approach to increase the output signal is to increase $Z_{load}$. Compared to a standard 50Ω load, a high-impedance load is often more desirable—it increases the detector output and enables direct mapping of hotspot resistance and photon number/energy resolution. However, high-impedance loading is difficult to achieve in practice. The lack of high-impedance coaxial cables makes it necessary to place the high-impedance amplifiers close to the detectors (at the low-temperature stage), which imposes a more stringent power budget. Even if a high-impedance amplifier is available, loading a standard SNSPD directly with high impedance can lead to latching, which can keep the SNSPD in a resistive state without resetting to superconducting state for subsequent detection events.

SUMMARY

Conventional readout of a superconducting nanowire single-photon detector (SNSPD) sets an upper bound on the output voltage to be the product of the bias current and the load impedance, $I_B \times Z_{load}$, where $Z_{load}$ is limited to 50Ω in standard RF electronics. This limit is broke/exceeded by interfacing the 50Ω load and the SNSPD using an integrated superconducting transmission line taper. The taper is a transformer that effectively loads the SNSPD with high impedance without latching. It increases the amplitude of the detector output while preserving the fast rising edge. Using a taper with a starting width of 500 nm, a 3.6× higher pulse amplitude, 3.7× faster slew rate, and 25.1 ps smaller timing jitter is observed. The results match numerical simulation, which incorporates both the hotspot dynamics in the SNSPD and the distributed nature in the transmission line taper. The tapered design may become a useful tool to interface high-impedance superconducting nanowire devices to conventional low-impedance circuits.

Generally, a photodetector includes a biasing circuit configured to supply a bias current and a load in series with the bias current source and having a load impedance. The photodetector further includes a superconducting nanowire, in series with the biasing circuit and in parallel with the load, to conduct the bias current, the superconducting nanowire switching from a superconducting state to a resistive state in response to absorption of a photon wave packet, thereby diverting a portion of the bias current to the load. The photodetector also includes an impedance-matching taper, having a first end connected to the superconducting nanowire and a second end connected to the load, to increase a peak amplitude of an output voltage pulse on the load in response to diversion of the portion of the bias current to the load. The impedance-matching taper has an impedance greater than the load impedance at the first end and about equal to the load impedance at the second end. The photodetector also includes circuitry configured to measure the peak amplitude of the output voltage on the load and correlate it to the number of absorbed photons in the wave packet.

A method of detecting a photon wave packet includes running a bias current through a superconducting nanowire in parallel with a load, and absorbing the photon wave packet with the superconducting nanowire. Absorption of the photon wave packet diverts a portion of the bias current to the load via an impedance-matching taper. The method further includes measuring a peak amplitude of an output voltage pulse across the load caused by diversion of the portion of the bias current to the load. The method also includes determining a number of photons in the wave packet based on the peak amplitude of the output voltage pulse.

All combinations of the foregoing concepts and additional concepts discussed in greater detail below (provided such concepts are not mutually inconsistent) are part of the inventive subject matter disclosed herein. In particular, all combinations of claimed subject matter appearing at the end of this disclosure are part of the inventive subject matter disclosed herein. The terminology used herein that also may appear in any disclosure incorporated by reference should be accorded a meaning most consistent with the particular concepts disclosed herein.

BRIEF DESCRIPTIONS OF THE DRAWINGS

The patent or application file contains at least one drawing executed in color. Copies of this patent or patent application publication with color drawing(s) will be provided by the Office upon request and payment of the necessary fee.

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

Figure 12A:
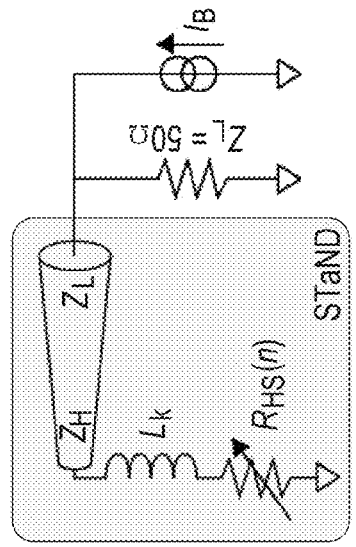
FIG. 12A illustrates a superconducting tapered nanowire detector (STaND).
Figure 12B:
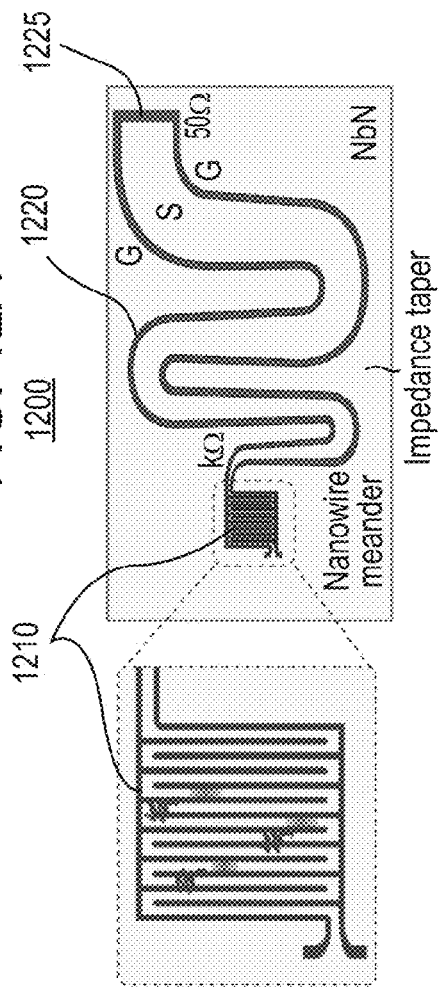
FIG. 12B illustrates an equivalent circuit diagram of the STaND of FIG. 12A.
Figure 12C:
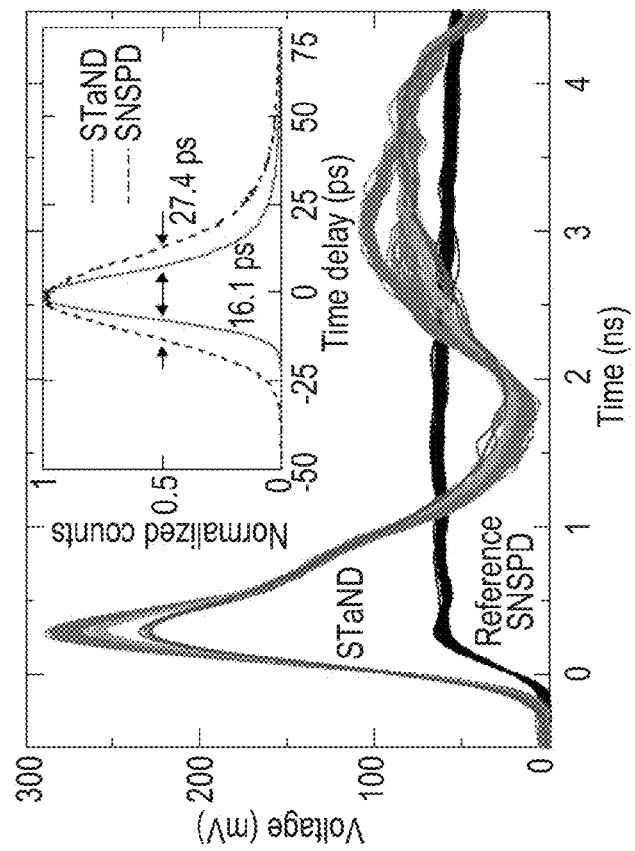

FIG. 12C is a plot illustrating that, compared to a regular SNSPD (black traces), the output pulses from the STaND of FIG. 12A (80 traces acquired at $\tilde{\mu}$=4.04) not only have larger amplitudes and showed level separation for multi-photon events. Red: single-photon events; orange: two-photon events; blue: three- or higher-photon events. Inset: instrument response functions at 1550 nm in the single-photon regime, where STaND showed a FWHM timing jitter of 16.1 ps as compared to 27.4 ps for the reference SNSPD.

Figure 12D:
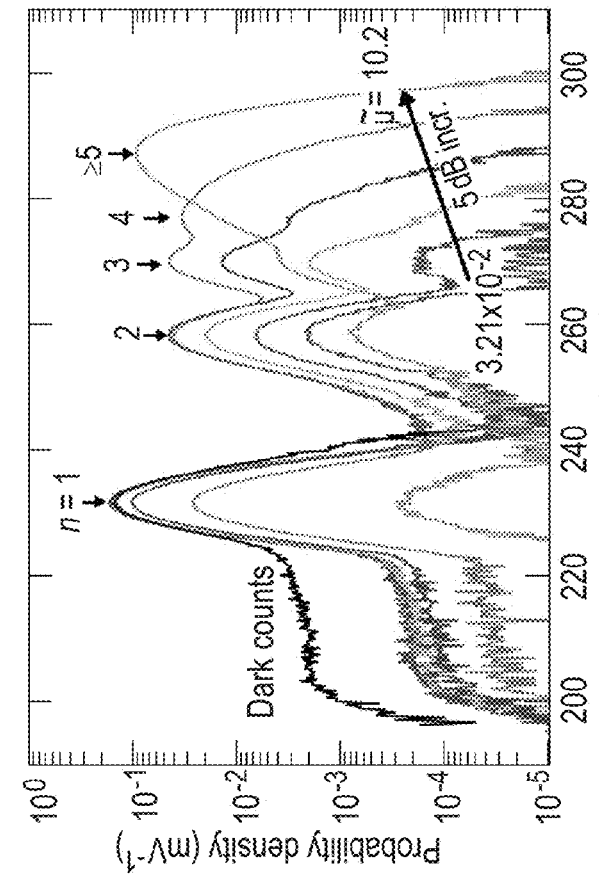

FIG. 12D is a plot illustrating histograms of the STaND's (of FIG. 12A) pulses under pulsed laser illumination with different effective mean photon numbers.

FIG. 13A is a plot illustrating Gaussian fitting of the pulse height histograms when the STaND was illuminated using a pulsed laser with $\tilde{\mu}$ at 1.01. Black dots: measurement data; dashed red line: fitting result; solid lines: decomposed Gaussian functions.

FIG. 13B is a plot illustrating Gaussian fitting of the pulse height histograms when the STaND was illuminated using a pulsed laser with $\tilde{\mu}$ at 3.19. Black dots: measurement data; dashed red line: fitting result; solid lines: decomposed Gaussian functions.

FIG. 13C is a plot illustrating photon counting statistics reconstructed from the pulse height distributions. Q (n) is the probability of detecting an n-photon event.

Figure 14A:
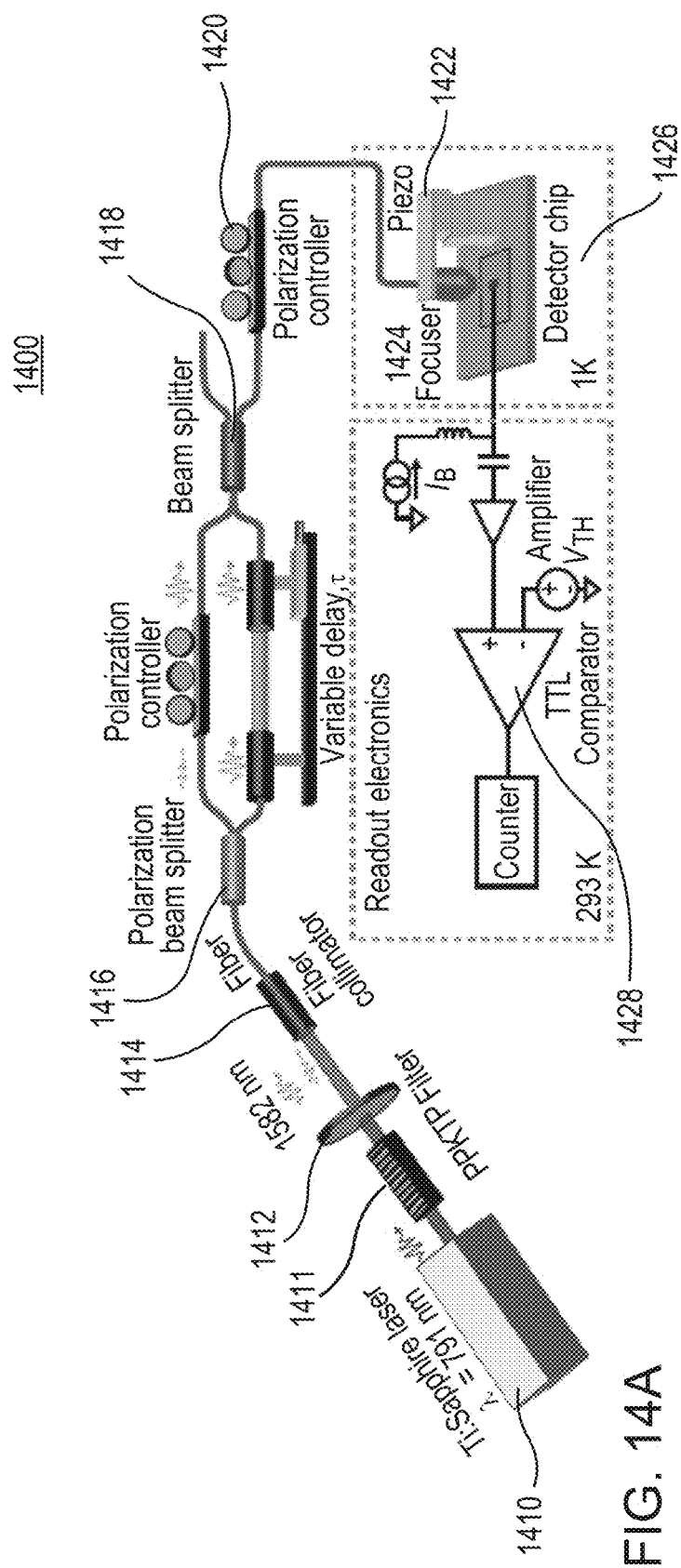

FIG. 14A illustrates an experimental setup for measuring Hong-Ou-Mandel (HOM) interference using a single STaND.

Figure 14B:
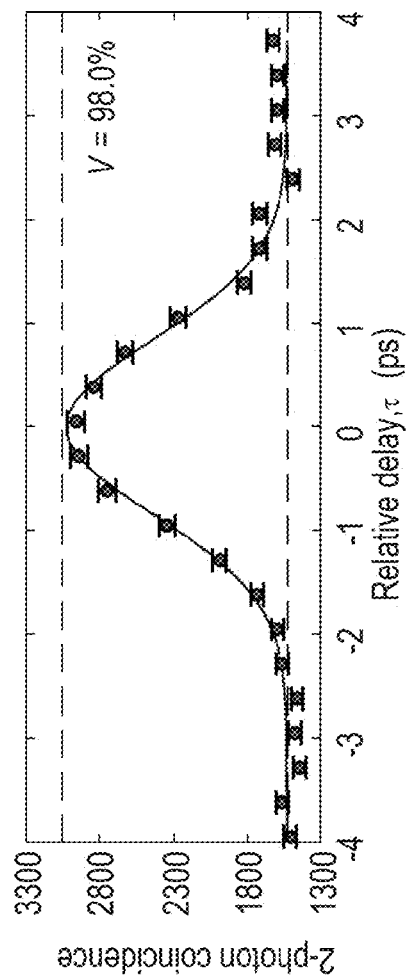

FIG. 14B is a plot of coincidence counts (background subtracted) in a 300 s time window as a function of relative delay between the two photons, showing clear bunching with interference visibility of 98% (well above the 50% classical limit). Error bar: one standard deviation due to Poisson noise; solid curve: Gaussian fit; dashed lines: baseline and theoretical ceiling for perfect interference (twice the baseline).

Figure 15B:
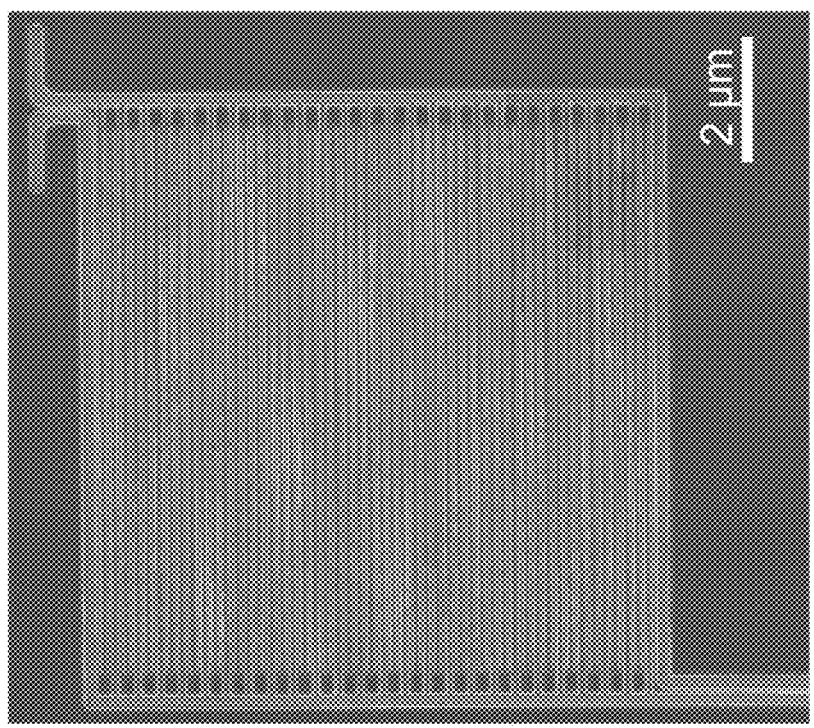
Figure 15A:
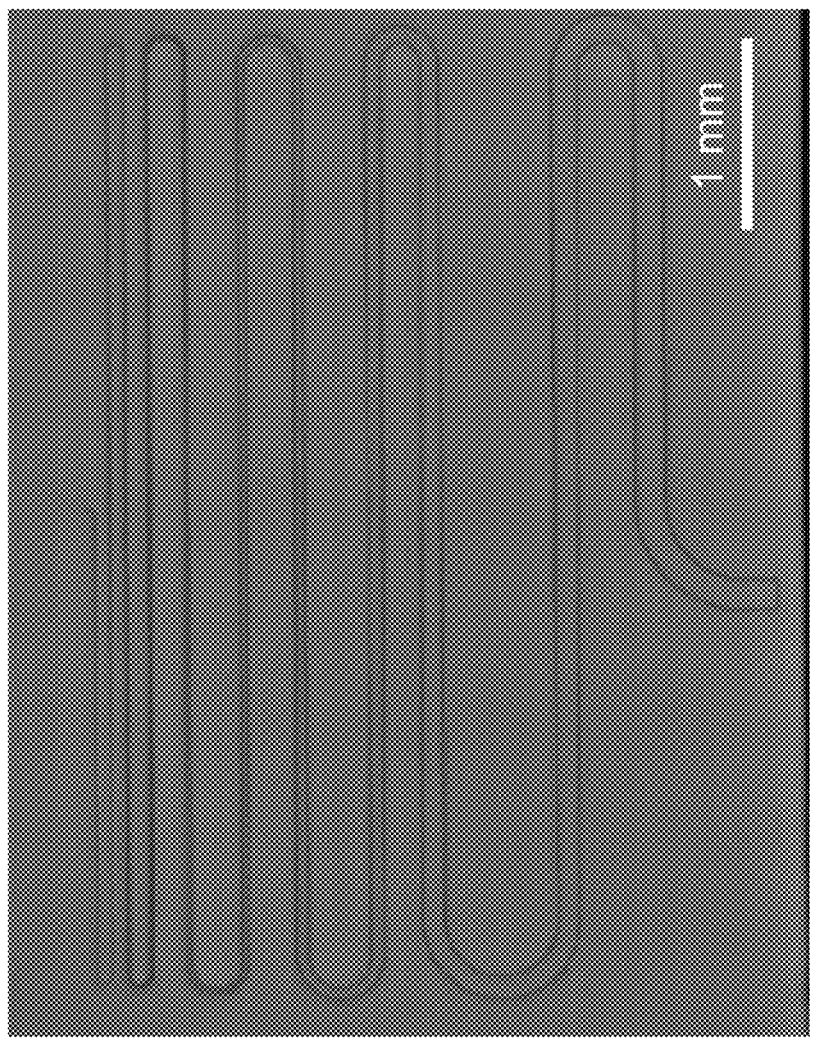

FIG. 15A is an optical micrograph of the taper and the STaND in FIG. 12A.

FIG. 15B is a scanning electron micrograph of the nanowire meander of the STaND. Dark regions are NbN; bright regions are the substrate, where NbN was etched away.

Figures 16A, 16B:
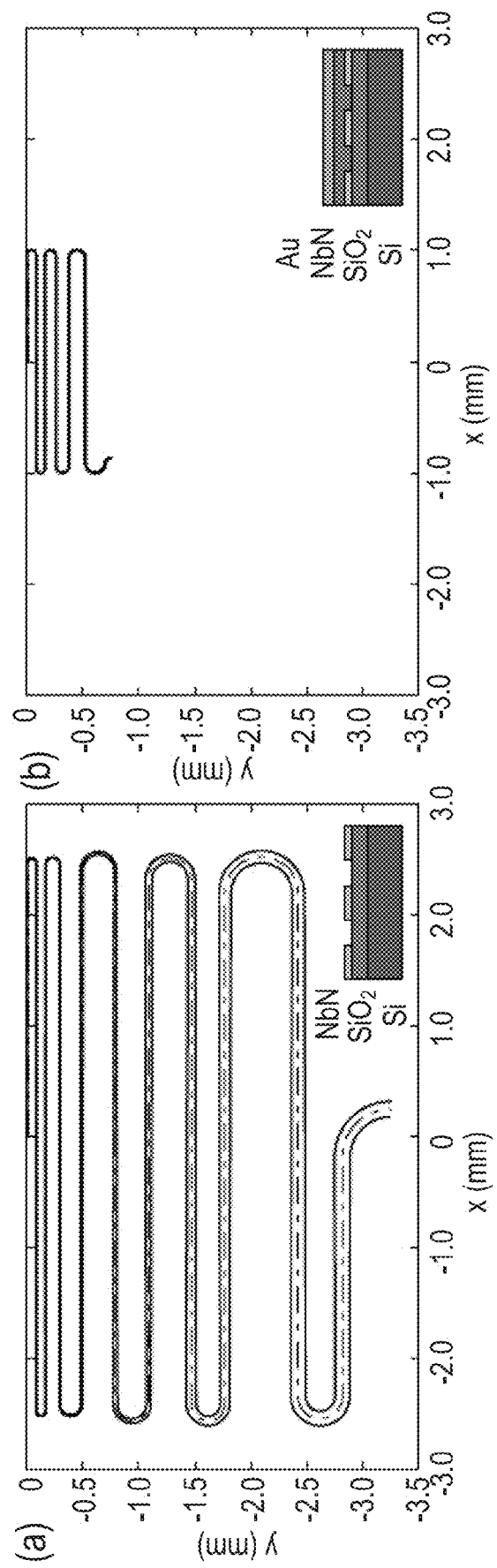

FIG. 16A illustrates the profile of the (co-planar waveguide) CPW taper used in the measured device.

FIG. 16B illustrates the profile of a CPW taper (1 μm gap) with top ground (grounded CPW).

Figure 17:
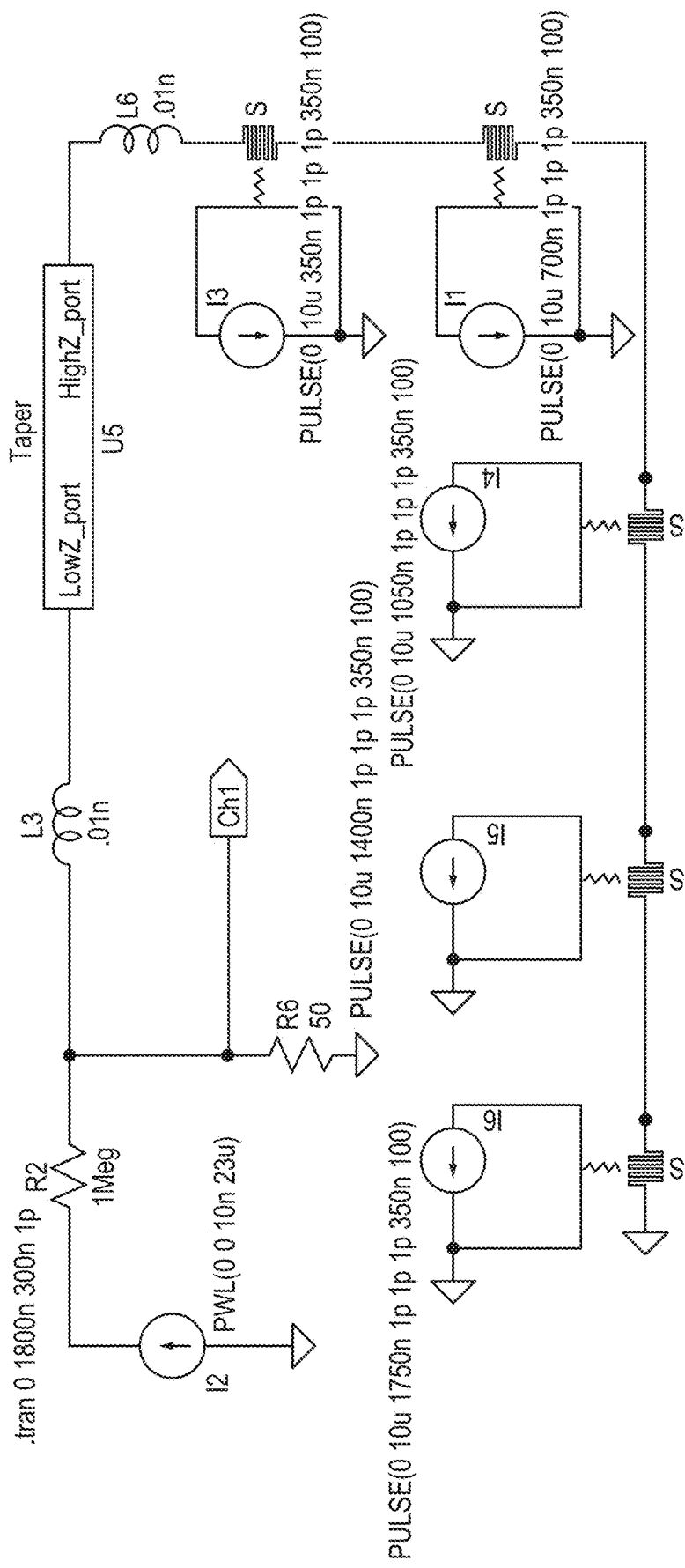

FIG. 17 illustrates SPICE simulation schematics for multi-photon events in the STaND. The taper is modeled as cascaded transmission lines (300 sections) with varying impedance and phase velocities. To simulate multi-photon events, the nanowire meander is divided into 5 SNSPDs (each with ⅕ inductance) and n of them are switched simultaneously.

Figures 18A, 18B, 18C, 18D:
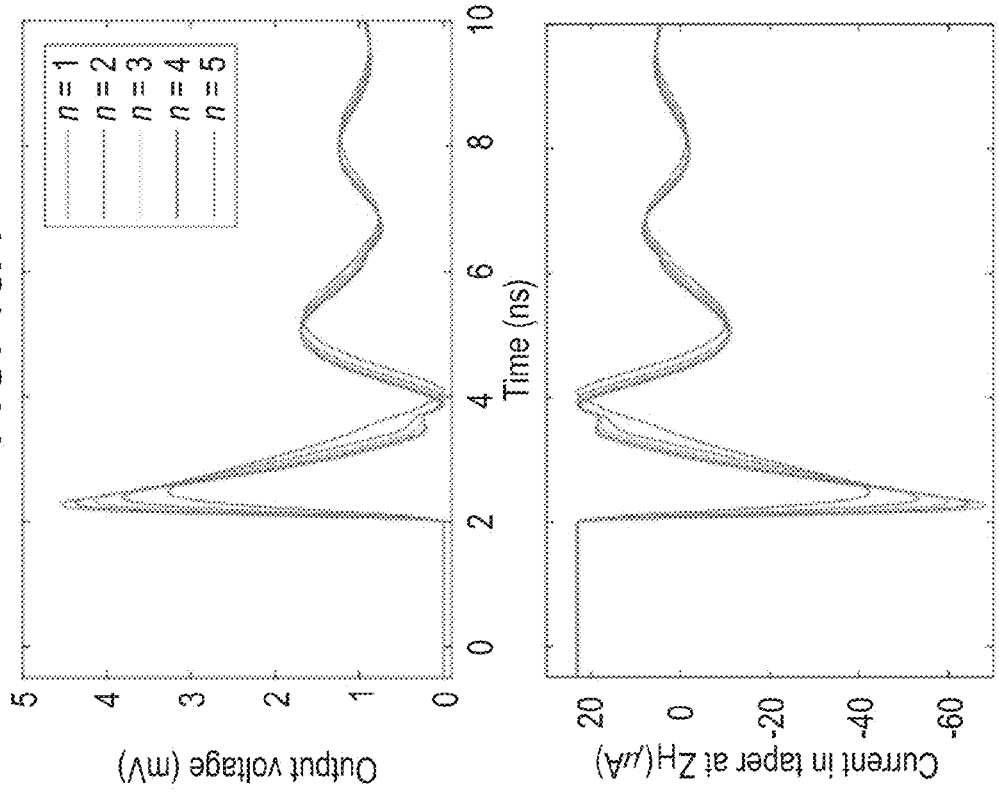

FIG. 18A is a plot of simulated output voltage on the 50Ω load resistor R6 in FIG. 17.

FIG. 18B is a plot of simulated current in the nanowire in the STaND, which is also the current at the high-impedance end of the taper (current flowing rightwards are defined as positive).

FIG. 18C is a plot of simulated current in the taper in the STaND at the low impedance (50Ω) end.

FIG. 18D is a plot illustrating the simulated evolution of total hotspot resistance in the nanowire meander.

Figures 19, 20:
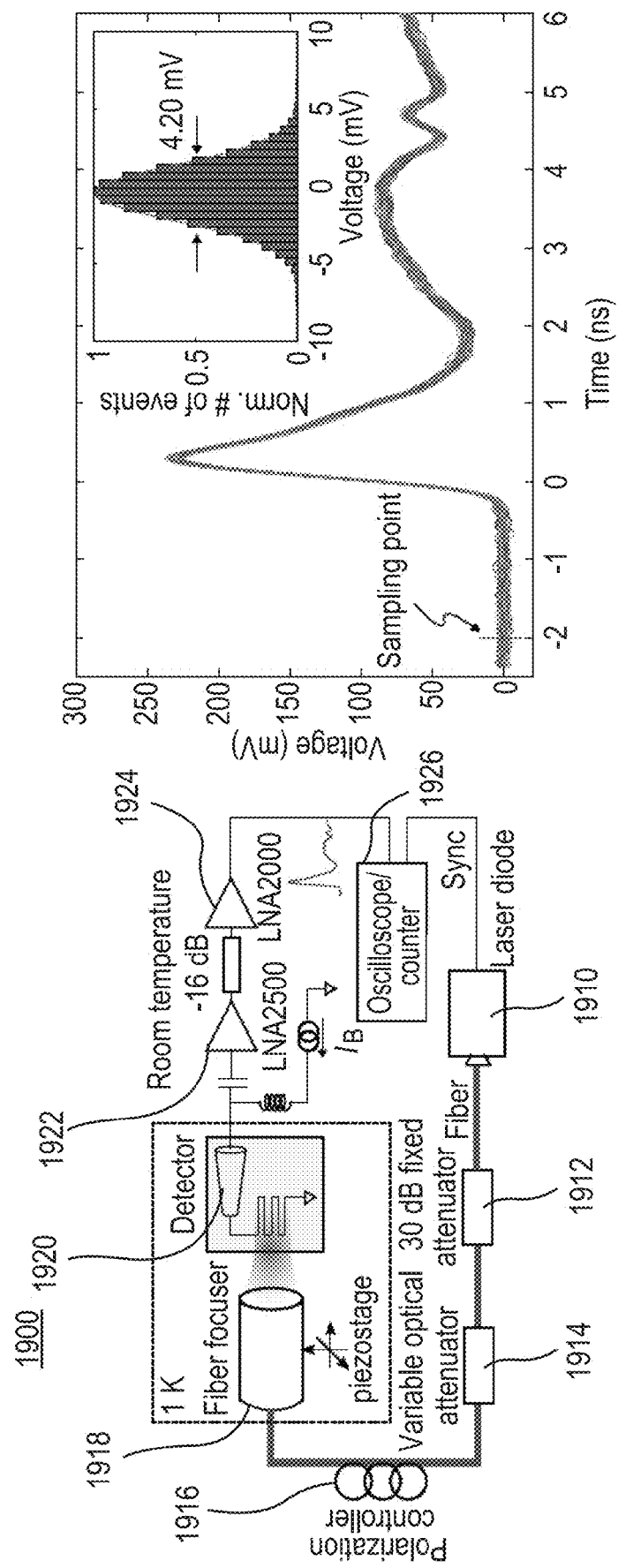

FIG. 19 illustrates a measurement setup for characterizing the STaND with classical light sources.

FIG. 20 is a plot of system electrical noise for the setup illustrated in FIG. 19. Specifically, FIG. 20 shows the STaND's output pulses, with the arrow pointing to the position where voltage noise is sampled. The inset shows the histogram of the sampled electrical noise, indicating a FWHM noise of 4.2 mV.

Figure 21A:
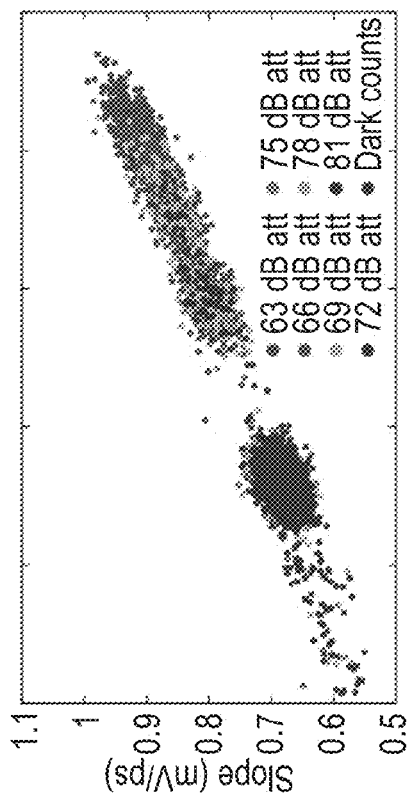

FIG. 21A is a plot illustrating the correlation between pulse height and rising slope.

Figure 21B:
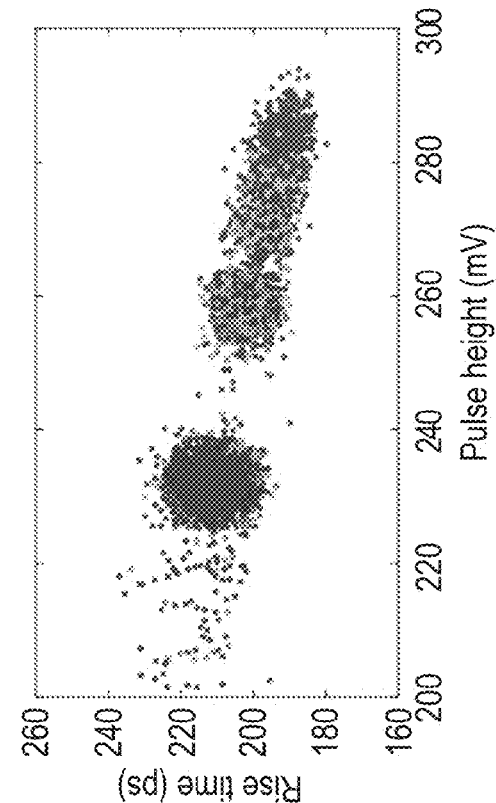

FIG. 21B is a plot illustrating the correlation between pulse height and rise time.

Figure 22:
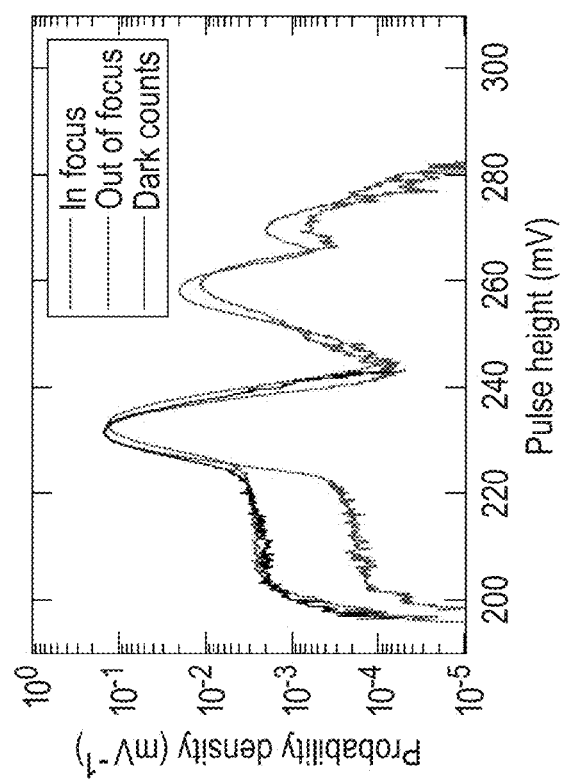

FIG. 22 is a plot comparing pulse height distributions under different illumination conditions.

Figure 23:
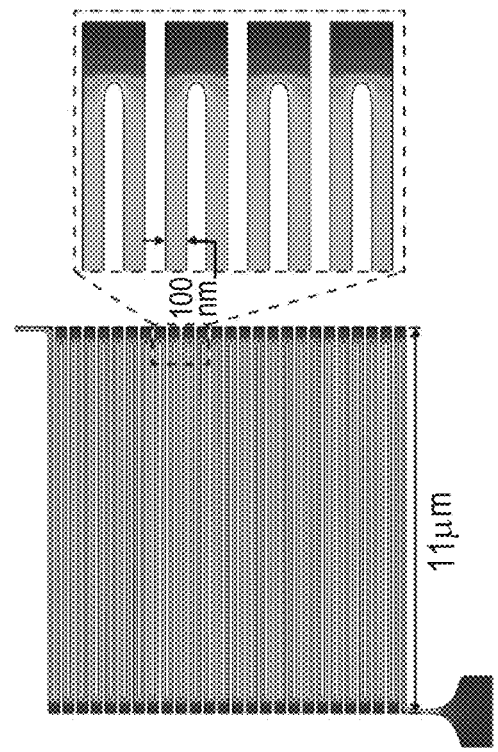

FIG. 23 illustrates geometry and current density near the bends.

Figure 24:
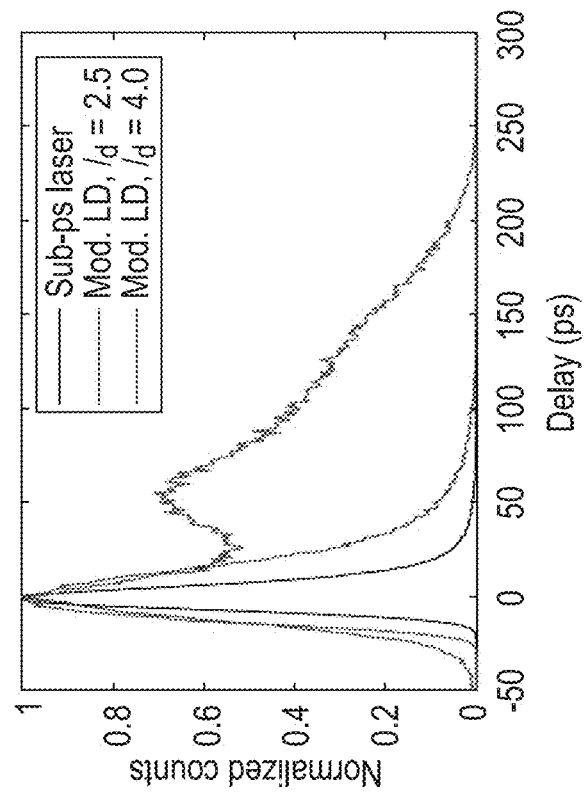

FIG. 24 is a plot illustrating estimation of laser pulse width using the STaND, where the time delay between the laser sync signal and detector pulses were measured.

Figure 25:
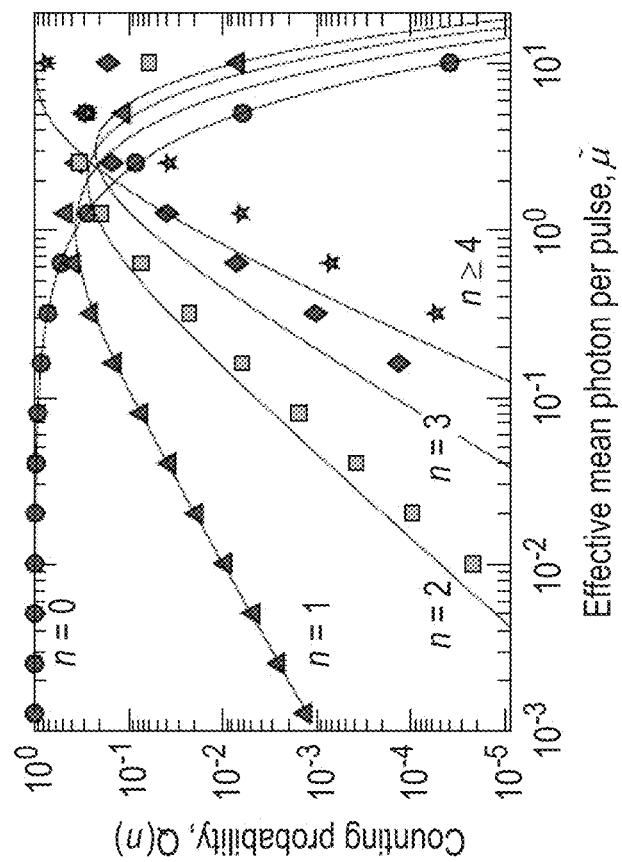

FIG. 25 is a plot for counting statistics when the modulated laser diode was driven to have a wider (≈100 ps FWHM, shown as orange curve in FIG. 24) pulse width. Higher-photon-number events are significantly underestimated. Symbols: measured data; lines: photon statistics of the source, $S(n)=e^{-\tilde{\mu}}\tilde{\mu}^n/n!$.

Figure 26:
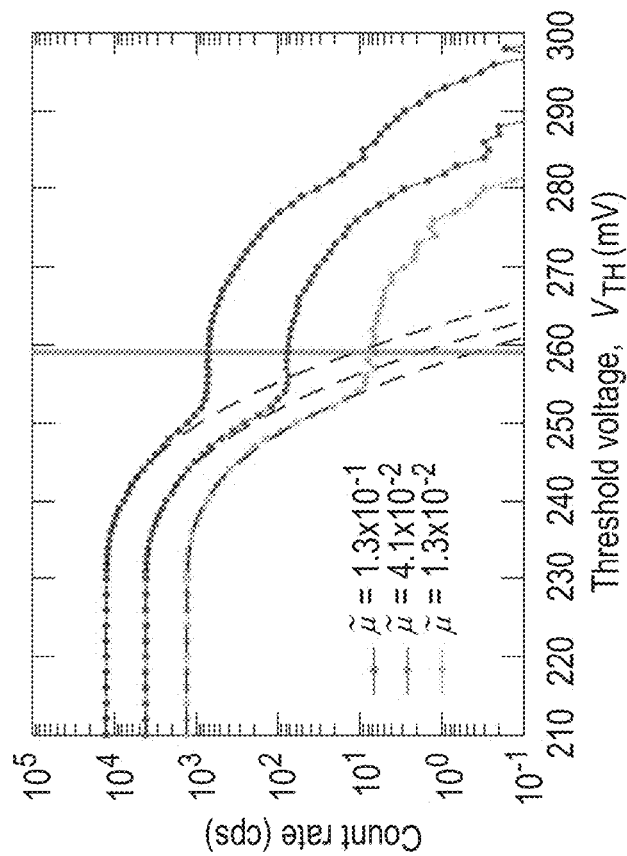

FIG. 26 is a plot illustrating calibration of the comparator threshold voltage for coincidence counting with a pulsed laser ($f_{rep}$=100 kHz). Dashed lines are erfc fitting, and the red line at 259 mV marks the chosen $V_{TH}$ for coincidence counting.

FIG. 27A is a plot illustrating normalized photon count rate (PCR) as a function of bias current.

FIG. 27B is a plot illustrating dark count rate (DCR) as a function of bias current.

FIG. 28A is a plot illustrating estimating reset time from pulse decay for the reference SNSPD. Exponential fitting ($e^{-t/\tau}$, where τ=L/R) of pulse decay shows that the reference SNSPD has τ of 9.5 ns.

FIG. 28B is a plot illustrating estimating reset time from pulse decay for the STaND. Exponential fitting ($e^{-t/\tau}$, where τ=L/R) of pulse decay shows that the STaND has τ of 28.6 ns.

Figure 29:
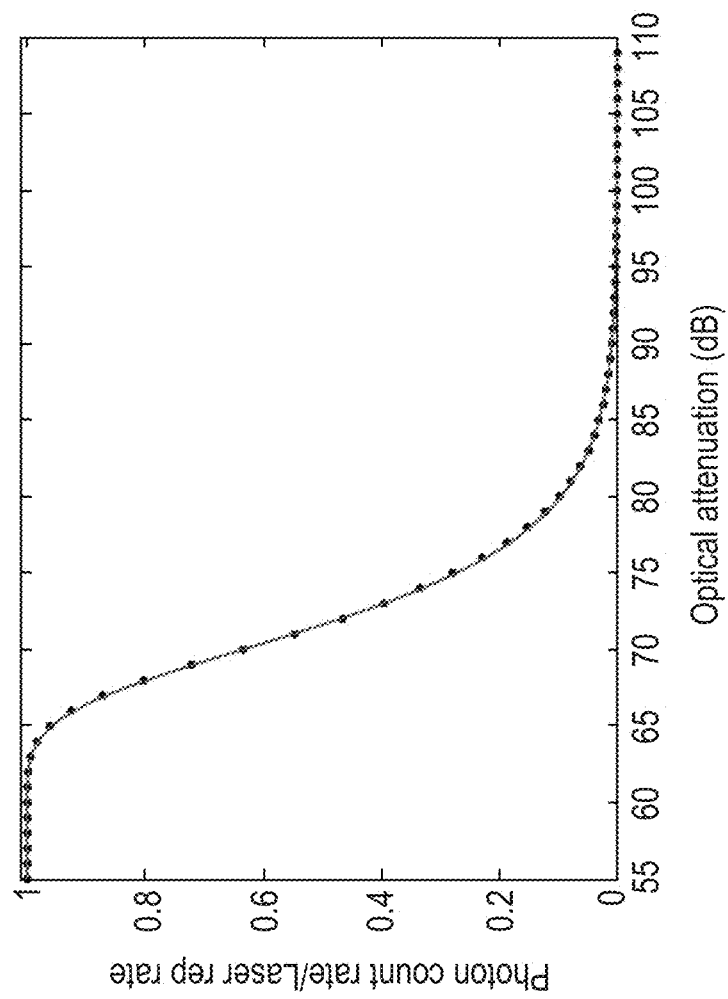

FIG. 29 is a plot resulting from estimating effective mean photon per pulse $\tilde{\mu}$.

Figure 30:
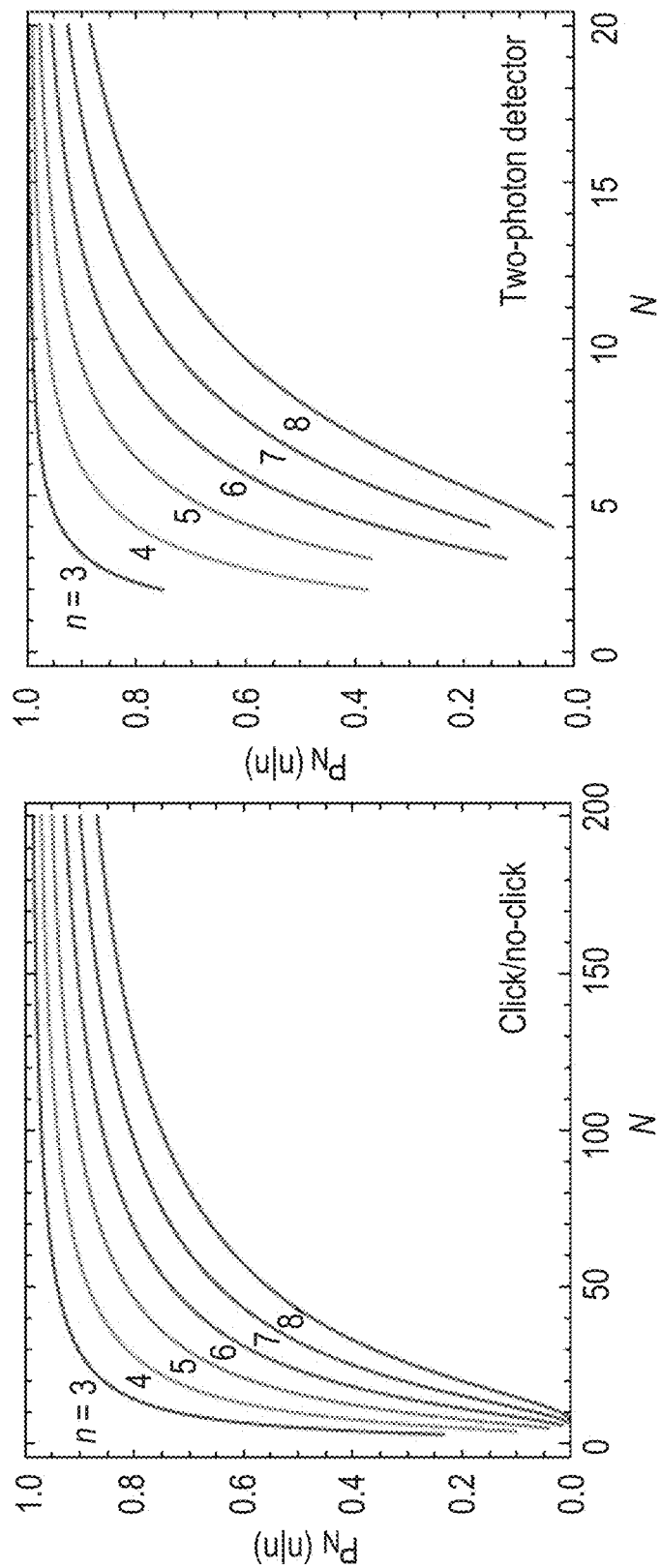

FIG. 30A is a plot illustrating resolving fidelity of large photon numbers using arrays of SNSPDs FIG. 30B is a plot illustrating resolving fidelity of large photon numbers using arrays of STaNDs.

FIG. 31 is an image of a meandering nanowire with tapers at both ends.

DETAILED DESCRIPTION

Generally, the ability to resolve the photon number of an optical field with precise timing is desirable for many applications in quantum information science, including linear optical quantum computing, quantum key distribution, quantum repeaters, and non-classical state generation. Significant effort has been made to develop photon-number-resolving (PNR) detectors, but their performance, especially at telecommunication wavelengths, is often limited in terms of timing resolution, reset time, dark count rate, and PNR fidelity.

Superconducting nanowire single-photon detectors (SNSPDs) are currently the leading single-photon counting technology at near-infrared wavelengths, with >90% efficiency, sub-3-ps jitter, few-ns reset time, and sub-Hz dark count rate. However, unlike transition-edge sensors (TES) or microwave kinetic inductance detectors (MKID), SNSPDs operate in a highly nonlinear mode and lack intrinsic photon number resolution. To overcome this problem, past efforts mainly focused on implementing arrays that include multiple closely-packed nanowires, each detecting one photon. They can be read out through certain multiplexing schemes but usually require complex fabrication or signal processing. Moreover, to avoid multiple photons hitting the same element, the array size should be much larger than the input photon number. These architectural limits have hindered the use of SNSPD arrays in applications with photon number resolution.

Closer scrutiny of the detection mechanism suggests that the lack of PNR capability in SNSPDs may not be intrinsic. It was previously recognized that n-photon absorption in a long meandered superconducting nanowire should induce n resistive hotspots (n is an integer). However, the resistance change due to different numbers of hotspots is hardly observable because of the abrupt mismatch between the kΩ resistance of the hotspots and the 50Ω impedance of the readout circuit. More specifically, regardless of n, the 50Ω load will divert most of the bias current in the nanowire, since n kΩ(2/(n kΩ+50Ω)≈1; therefore, the output voltage remains almost constant. While it is possible to develop a high-impedance cryogenic readout to avoid this limitation, the load impedance must be kept low to prevent latching effects. Otherwise, active resets may be needed. As a result, matching the readout to the hotspot resistance remains impractical. Alternatively, previous studies of the rising edge slope of the detector pulses instead of the output amplitude observed faster slew rates for multi-photon events. This is likely because larger hotspot resistance, that is created by multi-photon events, diverts current faster to the load for the same kinetic inductance of the nanowire. This method demonstrated the PNR capability in a conventional SNSPD, but the resolution was largely limited by the signal-to-noise ratio and variations of hotspot resistances.

Here, without high-impedance cryogenic amplifiers or active circuit elements, the $I_B \times 50\Omega$ limit is broken/overcome by using an integrated superconducting transmission line taper. The taper gradually transforms its characteristic impedance from kΩ to 50Ω, which effectively loads the SNSPD (the tapered SNSPD is also sometimes referred to as a superconducting tapered nanowire detector, or STaND) with a kΩ impedance without latching. The taper is designed to be a co-planar waveguide (CPW) and fabricated from the same superconducting thin film as the SNSPD. Using a taper with a starting width of 500 nm and nominal passband from 200 MHz, 3.6× higher output voltage is observed, with no added noise compared to the non-tapered reference device. This voltage gain is equivalent to an 11 dB passive, dissipation-free cryogenic amplifier. Despite its large inductance, the taper preserves the detector's fast rising edge, resulting in an increased slew rate and reduced timing jitter (from 48.9 ps to 23.8 ps). The integrated impedance taper demonstrated here is useful for interfacing high-impedance nanowire-based devices to conventional low-impedance components, such as memory, and electrical or optical modulators.

Figure 1A:
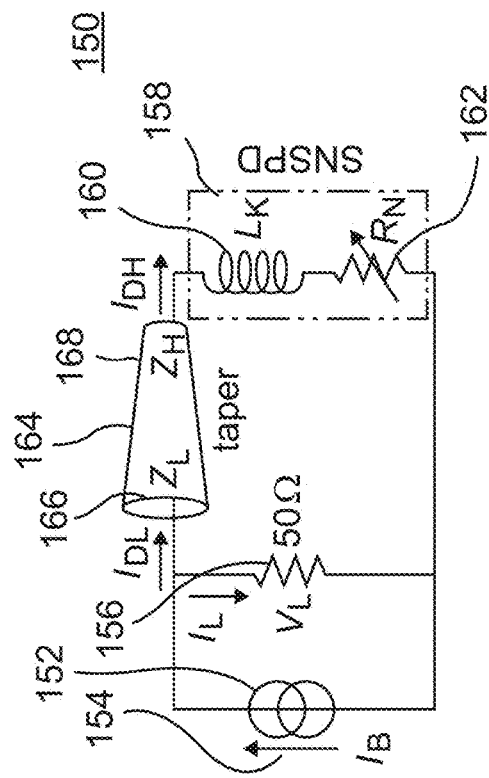
FIG. 1A illustrates a circuit diagram of a conventional superconducting nanowire single-photon detector (SNSPD) readout.

FIG. 1A shows a circuit model of a SNSPD photodetector circuit 100 that includes a conventional SNSPD 102, where the SNSPD 102 is modeled as a kinetic inductor $L_K$ 104 in series with a time-dependent variable resistor $R_N$ 106. When an incident photon triggers the SNSPD 102, $R_N$ 106 switches from 0 to about kΩ within about hundreds of picoseconds and diverts the bias current $I_B$ 108 (from a biasing circuit) to the load 110. The evolution of $R_N$ 106 is determined by the non-linear electrothermal feedback in the detector 100. The currents from the bias source ($I_B$ 108), in the nanowire ($I_D$ 112), and to the load 110 ($I_L$ 114) follow Kirchhoff's law $I_L = I_B - I_D$. The maximum $I_L$ 114 is therefore limited to $I_B$ 108, corresponding to the case where $R_N$ 106 pushes all of the current out of the nanowire ($I_D = 0$). The output voltage on the load 110 should not exceed $I_B \times 50\Omega$. In practice, due to the electro-thermal feedback, $I_D$ 112 usually has some remainder, which depends on the bias current 108, kinetic inductance, and thermal constants of the materials.

Figure 1B:
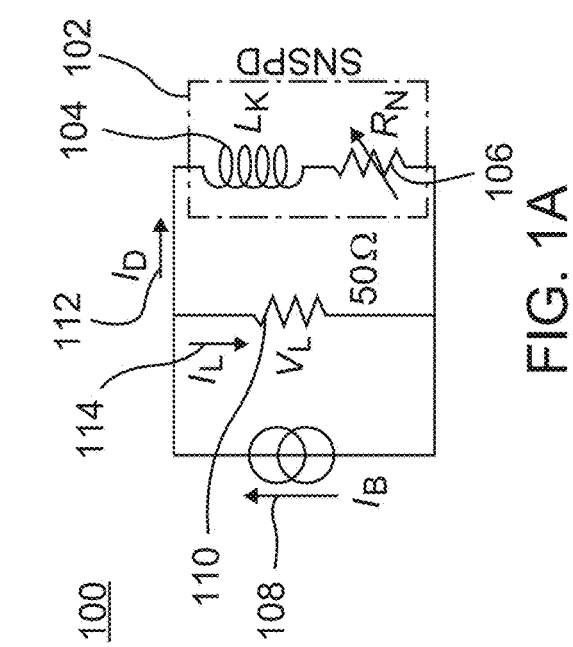
FIG. 1B illustrates a circuit diagram of an SNSPD with a tapered readout. The taper loads the SNSPD with high impedance while interfacing at its other end to the readout electronics at 50Ω, resulting in a larger output voltage.

FIG. 1B shows a circuit diagram of a SNSPD photodetector circuit 150 for tapered readout. The photodetector circuit 150 includes a biasing circuit 152 (e.g., a low-noise battery, a resistor, a bias tee, and/or the like) that supplies a bias current $I_H$ 154. Similar to FIG. 1A, a load 156 (e.g., a radio-frequency (RF) amplifier) is positioned in series with the biasing circuit 152, and can have a characteristic impedance (e.g., 50Ω or 75Ω). The photodetector 150 also includes a SNSPD readout circuit 158 that is in series with the biasing circuit 152 and in parallel with the load 156. The circuit 158 can be represented as a kinetic inductor $L_K$ 160 in series with a time-dependent variable resistor $R_N$ 162. As described above, the circuit 158 can switch from a superconducting state to a resistive state upon absorption of a photon wave packet, and can have a resistance that varies sub-linearly with the number of photons in the wave packet. In this manner, it can divert a portion of the bias current 154 to the load 156. Also included in the photodetector 150 is an impedance-matching taper 164. The taper 164 is inserted between the SNSPD circuit 158 and the load 156, with a lower impedance $Z_L$ (e.g., about 50Ω) on a load end 166 and a higher impedance $Z_H$ (e.g., at least about 1 kΩ) on a detector end 168.

Figure 1C:
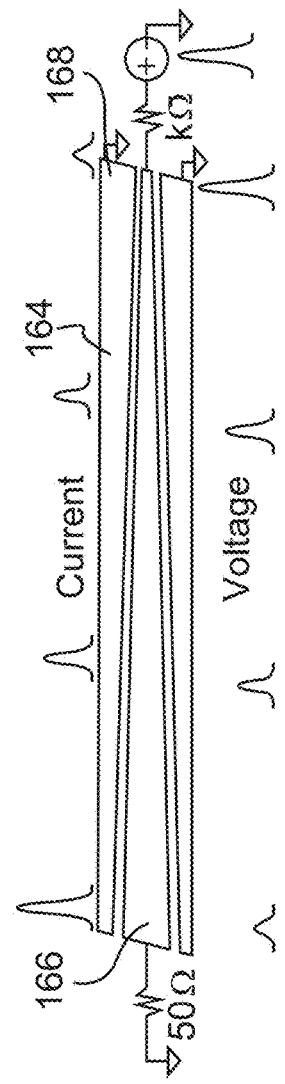
FIG. 1C illustrates a schematic diagram of a co-planar waveguide transmission line taper. When an electrical pulse is launched from the high-impedance end, its voltage drops but current increases while traveling towards the low-impedance end.

The taper 164 can be fabricated as a transmission line from the same superconducting thin film that the SNSPD circuit 158 is composed of. The taper 164 can include a continuous nanowire transmission line without any dissipative elements, as illustrated in FIG. 1C. The taper 164 can be high-pass, i.e., it can work as a transformer at frequencies above the taper's cut-off frequency and act as an inductor at low frequency, when the taper length is smaller than the guided wavelength. The taper 164 can make the SNSPD's output amplitude sensitive to the number of photon-induced hotspots, and enable more practical photon number resolution as follows. During typical use, the bias current 154 runs through the SNSPD circuit 158 in parallel with the load 156. When an incident photon (e.g., part of the photon wave packet) triggers the SNSPD circuit 158, it is absorbed, causing $R_N$ 162 to switch ON and push the bias current $I_{DH}$ away from the circuit 158. Instead of diverting the current directly to the 50Ω load 156 as in the conventional readout, the SNSPD 158 injects current to the taper 164 at the end 168 having the impedance $Z_H$. As the electrical pulse travels towards the lower impedance end 166, its current amplitude increases while the voltage amplitude drops, with a ratio that satisfies the change of impedance (FIG. 1C). Assuming an ideal broadband transformer with perfect impedance matching and power transmission, the current leaving the low-impedance end 166 (to the load) $\Delta I_{DL}$ is related to the current injected to the high-impedance end $\Delta I_{DH}$ by $\Delta I_{DL}^2 Z_L = \Delta I_{DH}^2 Z_H$. In the transmission line taper 164, this relation is valid at high frequency (within the passband of the taper), which dominates the rising edge of the detector pulse. In the case where the SNSPD 158 pushes all the bias current out, i.e., $\Delta I_{DH} = I_B$, the current diverted to the load 156 can be as large as $I_L = \Delta I_{DL} = I_B \sqrt{Z_H/Z_L}$, corresponding to an output voltage of $V_L^{taper} = I_B \times 50\Omega \sqrt{Z_H/Z_L}$ and an effective voltage gain of $$\sqrt{\frac{Z_H}{Z_L}}$$

with respect to the conventional readout, i.e., by virtue of the presence of the taper 164, the output voltage on the load 156 is increased. When terminated with the high-impedance taper 164, the SNSPD 158 can latch for a few nanoseconds, leaving the residual current at the hotspot current $I_{SS}$, and then resets through reflection from the taper. As described in greater detail below, the actual voltage gain can be less than $\sqrt{Z_H/Z_L}$ due to the electro-thermal feedback and limited taper bandwidth. The peak amplitude of this output voltage across the load 156, caused by diversion of a portion of the bias current 154 towards the load, can be measured and used to determine the number of photons in the wave packet.

The photodetector 150 may include additional circuitry to measure the peak amplitude of the output voltage on the load 156 and to correlate the peak amplitude to the number of absorbed photons in the wave packet. Such additional circuitry may include, as illustrated in FIG. 14A and described in greater detail below, a comparator for level discrimination, i.e., functioning as a discriminator. In the additional circuitry may additionally include a controller, which can be any suitable processing device configured to run and/or execute a set of instructions or code associated with the photodetector 150. The controller can be, for example, a suitably programmed processor, a Field Programmable Gate Array (FPGA), an Application Specific Integrated Circuit (ASIC), a Digital Signal Processor (DSP), and/or the like.

Figure 1E:
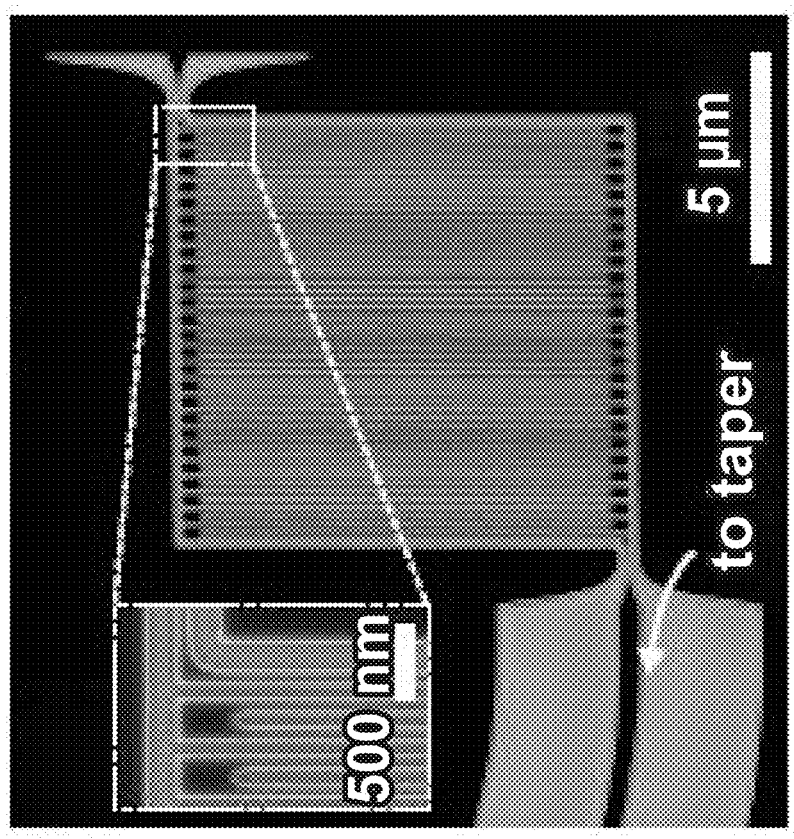
FIG. 1E is a scanning electron micrograph of the SNSPD. Dark area: NbN; light area: substrate.
Figure 1D:
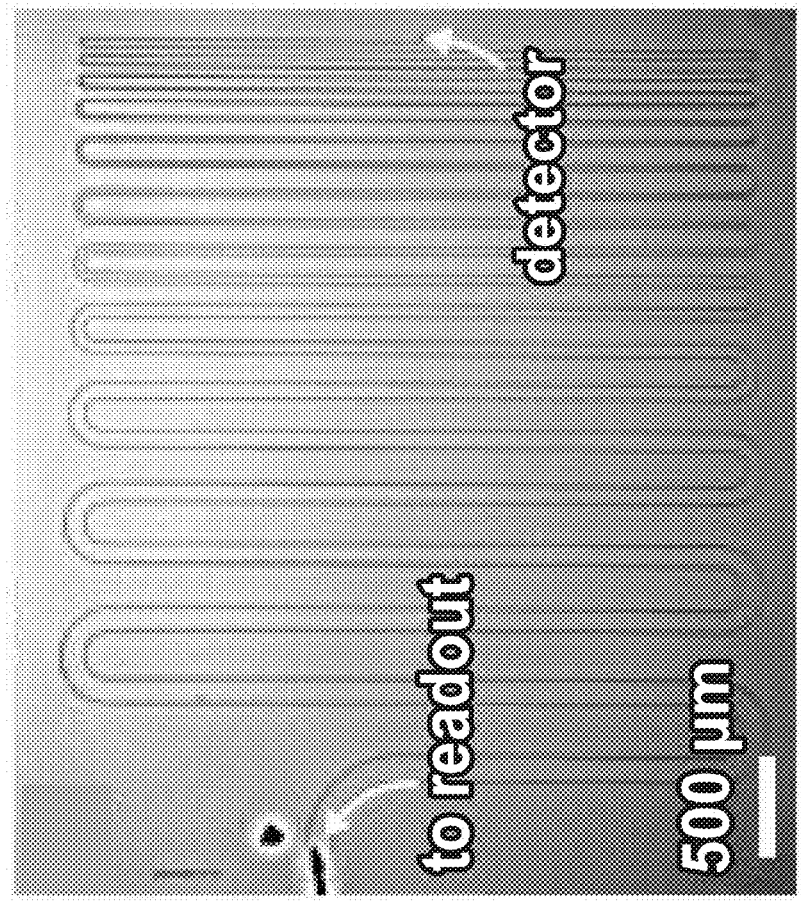
FIG. 1D is an optical micrograph of the integrated transmission line taper. Light area: niobium nitride (NbN); outlines: substrate.

FIG. 2D shows an optical micrograph of a fabricated SNSPD (e.g., the SNSPD circuit 158) with a meandered transmission-line taper. The bright area is NbN, and the dark area is the substrate, where the NbN is etched away. The NbN is sputtered at room temperature on a silicon substrate with a 300 nm thick thermal oxide layer. The film has a critical temperature of 8.1 K and room-temperature sheet resistance of 342 Ω/sq. The sheet inductance is estimated to be 80 pH/sq by fitting the falling edge of the output pulse from a reference detector. The SNSPD is 100 nm wide, densely packed with a 50% fill factor, and spans a rectangular area of 11 μm×10 μm (see FIG. 1E), though it can span any suitable area including an area of less than about 1 mm², less than 100 μm², including all values and sub-ranges in between. A 200 nm gap surrounds the detector region to reduce the proximity effect in fabrication. On the same chip, non-tapered detectors are fabricated as references.

The taper is designed to be a 5672-section cascaded transformer with a lower cut-off frequency of 200 MHz and a total electrical length of 851 mm, following the Klopfenstein profile. The physical length is 77.9 mm due to the slow phase velocity of the superconducting transmission line, and the total inductance is 1.410 pH (see FIG. 5 for simulated S parameters). This length is chosen so that the maximum reflection in the passband (≥200 MHz) does not exceed −20 dB. The total electrical length is calculated as $l_e=Ac/2\pi f_{co}$, where $f_{co}$ is the nominal cut-off frequency and c is the speed of light in vacuum. A is a factor that determines the maximum reflection in the passband and is calculated as $\cosh(A)=\rho_0/\rho_{pb}$, where $\rho_0$ is the initial reflection coefficient (i.e., without taper) and $\rho_{pb}$ is the maximum passband reflection coefficient (taken as 0.1 here). For design convenience, Klopfenstein's original approach is followed, and took $\rho_0=0.5 \ln(Z_H/Z_L)$ instead of $(Z_H-Z_L)/(Z_H+Z_L)$.

Figure 2A:
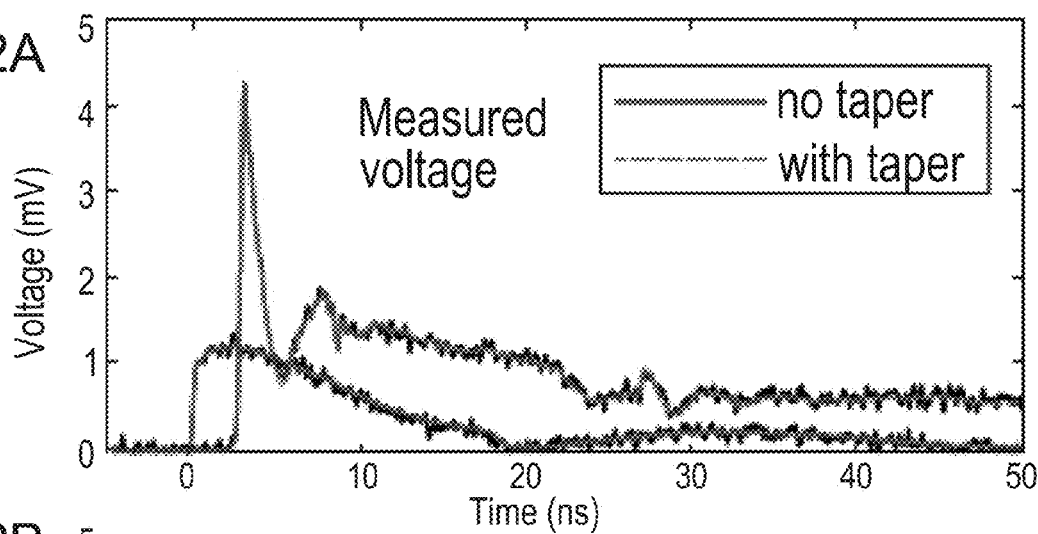
FIG. 2A is a plot of measured output voltages for both the tapered and non-tapered detectors, with amplifier gain removed. The black traces are single-shot waveforms, and the superimposed lines are averaged waveforms.

FIG. 2A shows the measured pulse shapes from the reference and tapered detectors. The amplifier gain is removed to better compare the pulse shapes with simulation results described below. To avoid phase distortion in reconstructing the unamplified pulses, a weighted gain, $\bar{G}=\int df PSD(f)G(f)/\int df PSD(f)$ is used, where PSD(f) is the power spectral density of the pulse, and G(f) is the measured system gain spectrum (see FIG. 7). $\bar{G}$ is calculated to be 20.5 dB. As shown in FIG. 2A, a voltage gain of 3.6 and an extra delay of 2.8 ns is observed from the tapered device compared to the reference device (by aligning the electrical pulses to the optical references). This voltage enhancement is equivalent to a passive, excessive-noise-free 11 dB amplifier.

Figure 2B:
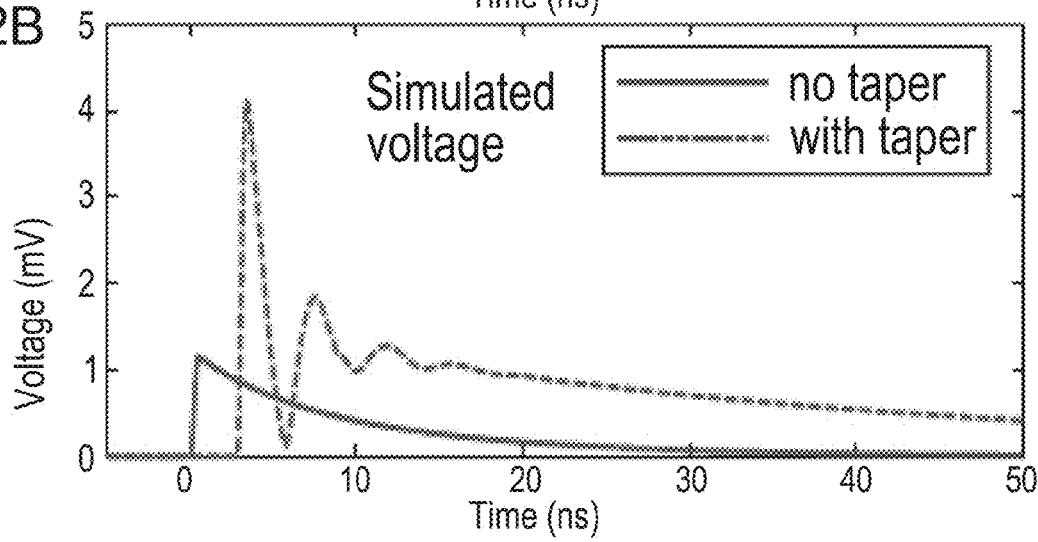
FIG. 2B is a plot of simulated output voltages for both the tapered and non-tapered detectors.

FIG. 2B plots the simulated load voltages, showing a voltage gain of 3.5 and a delay of 2.8 ns, as compared to the measured gain of 3.6 and delay of 2.8 ns. The subsequent peaks in the output voltage are spaced by ≈4.2 ns, which can correspond to the round trip time in the taper. The single-trip delay of the taper calculated from the reflection peaks (2.1 ns) is shorter than the delay between the tapered detector and reference detector (2.82 ns), because the hotspot grows for a longer period of time and to a larger resistance in the tapered detector, as can be seen in the simulated currents.

Figure 2C:
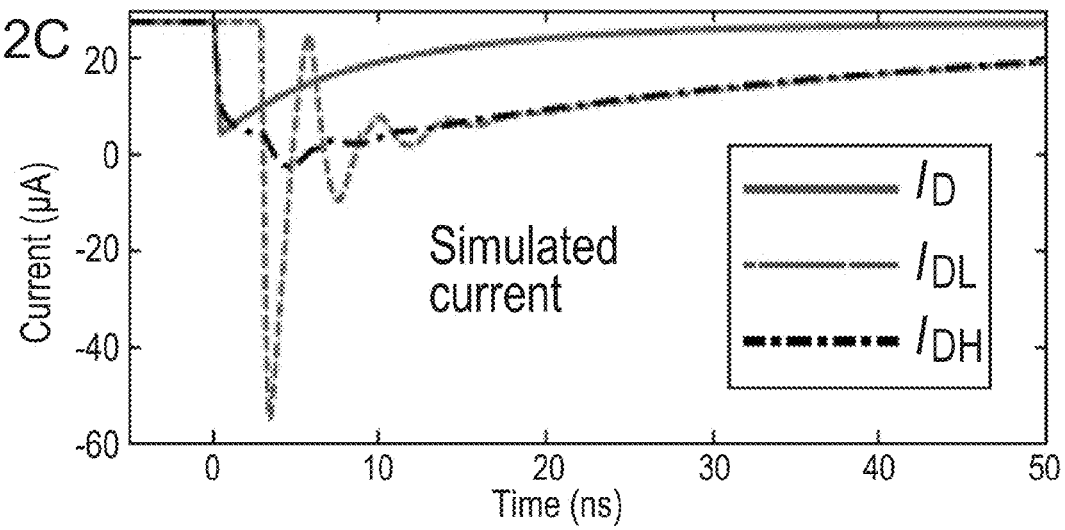
FIG. 2C is a plot of simulated current distributions for the tapered and non-tapered SPSPDs. $I_D$ is the current in the SNSPD for a non-tapered readout. $I_{DL}$ and $I_{DH}$ are the currents on the low-impedance and high-impedance ends of the tapers in the tapered detector, respectively.

FIG. 2C shows the simulated currents. For the tapered detector, the current in the nanowire ($I_{DH}$) first drops at a similar rate as the non-tapered case ($I_D$), then enters an intermediate plateau due to latching. A similar current plateau and latching behavior are often observed when loading an SNSPD with a kΩ resistor. However, at 4.6 ns, $I_{DL}$ drops again and kicks the detector out of the latching state. The drop in current can be interpreted as the reflection of microwave signals in the transmission line taper. Alternatively, it can be interpreted as the distributed capacitors in the transmission line drawing current from the SNSPD. After a few oscillations, the current in the detector recovers with an τ=L/R exponential time constant. Here, L is the total inductance of the SNSPD and the taper (at low frequency, the taper behaves as an inductor), and R is 50Ω. The simulated currents at the high- and low-impedance ends of the taper follow a general understanding on how a transformer works. In this particular detector and taper design, the maximum counting rate (estimated as 1/3τ) decreases from 40.3 MHz (L=414 nH) for the non-tapered detector to 9.1 MHz (L=1.824 μH) for the tapered detector.

Figure 3A:
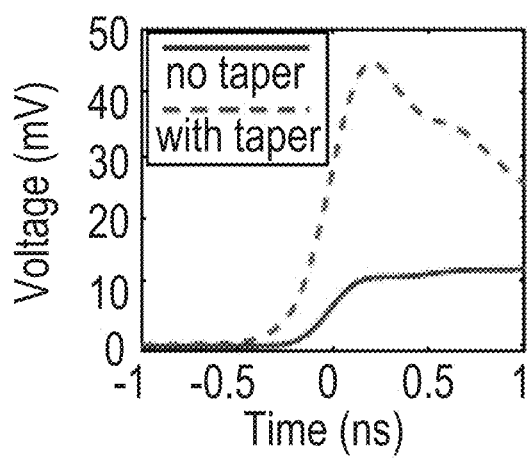
FIG. 3A is a plot illustrating averaged rising edges of the detector pulses from the tapered and non-tapered detectors (amplifier gain not removed).
Figure 3B:
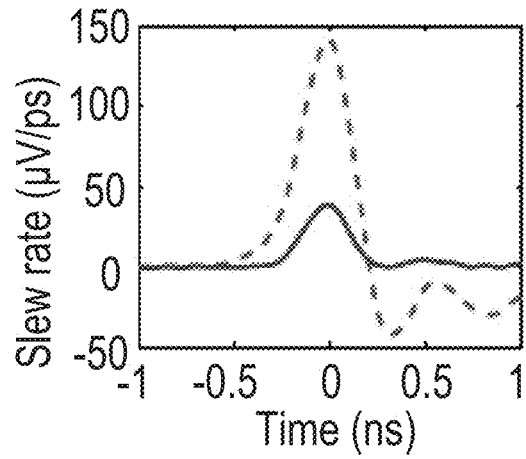
FIG. 3B is a plot of the corresponding slew rate calculated as dV/dt from the voltage measurements show in FIG. 3A.

The impedance taper amplifies the output pulse without sacrificing the fast rising edge, resulting in a faster slew rate. FIG. 3A compares the averaged rising edges of the detector pulses from the reference and tapered detectors (with amplifier gain). As shown in FIG. 3B, the maximum slew rates (dV/dt) are 39 μV/ps for the reference detector, but 143 μV/ps (3.7 times faster) for the tapered detector.

The slew rate directly impacts the electrical noise contribution on the timing jitter, usually referred as noise jitter, $\sigma_{noise}$. The noise follows a Gaussian distribution and has standard deviations of 559 μV and 547 μV for the reference and tapered detector, respectively. Taking their respective fastest slew rates, the reference detector has a standard deviation $\sigma_{noise}$ of 14.3 ps and the tapered detector has a $\sigma_{noise}$ of 3.8 ps.

Figure 3C:
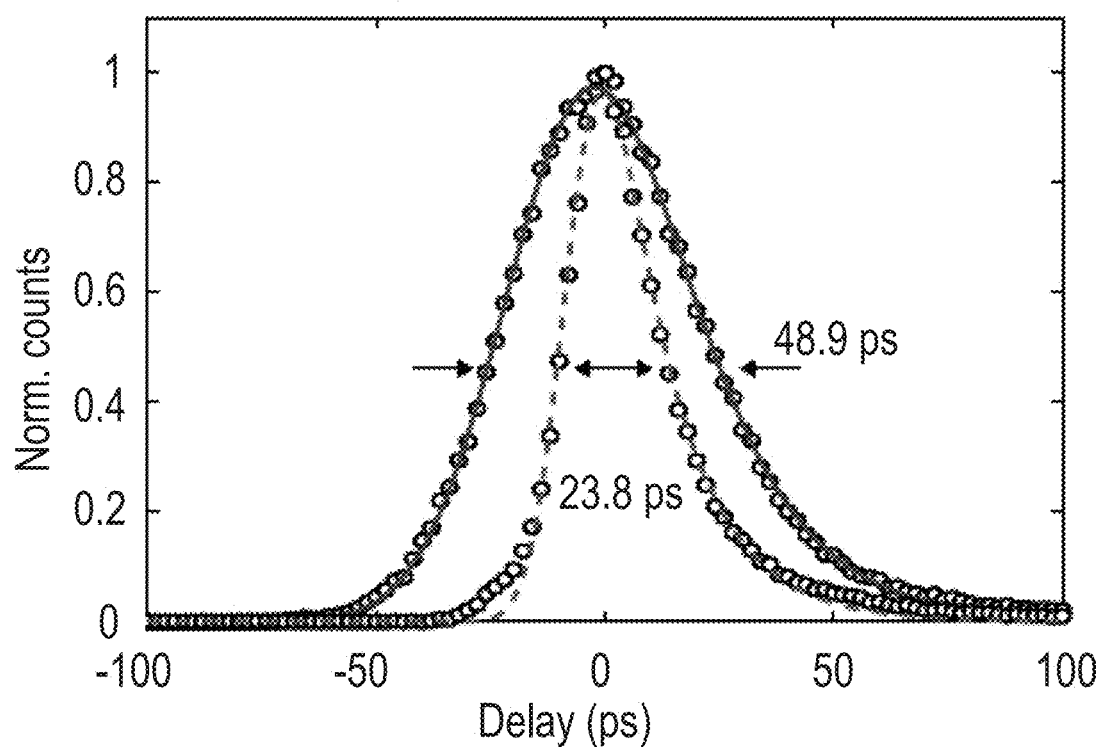
FIG. 3C is a plot of normalized photon counts from the detector vs. time delay between the detector pulse and a probing laser pulse, illustrating that the measured full-width half-maximum (FWHM) timing jitter reduced from 48.9 ps to 23.8 ps with the tapered readout at 1550 nm.

FIG. 3C shows the instrument response function (IRF) of the reference and tapered detectors at 1550 nm illumination wavelength. With the impedance taper, the full-width half-maximum (FWHM) jitter is reduced from 48.9 ps to 23.8 ps. The IRF is fitted using an exponentially modified Gaussian distribution, and found σ=16.8 ps and 1/λ=17.4 ps for the reference detector, and σ=6.5 ps and 1/λ=13.6 ps for the tapered detector. Here, a is the standard deviation of the normal distribution and λ is the exponential decay rate. The detectors show similar jitter reduction at 1064 nm (FIG. 10), where both detectors operated on the saturation plateau (see FIG. 9 for the photon count rate vs. bias current curves). The FWHM jitter reduced from 47.0 ps (σ=16.4 ps, 1/λ=15.9 ps) to 22.4 ps (σ=6.2 ps, 1/λ=12.5 ps). A leading edge tail in IRF for the tapered detector is observed. It is likely due to the counting events from the taper or the transition region between the taper and the detector. This effect can be reduced by focusing the optical mode in the center of the detector active area, through self-aligned fiber coupling or focusing lenses.

The SNSPD is treated as a lumped element because the nanowire is closely meandered and has a dispersion similar to an ideal inductor at the frequency of interest. Despite this choice, multi-photon absorption can generate a different hotspot resistance than the single-photon events. The impedance taper provides an effective kΩ load, and may allow direct discrimination of hotspot resistance and hence photon numbers. In another scheme, where the nanowire is sparse or integrated into a transmission line, the taper can serve as an impedance-matched readout and has been used to resolve photon location and photon numbers. The integrated taper can match a high-impedance nanowire-based device to a low-impedance systems.

Figure 4:
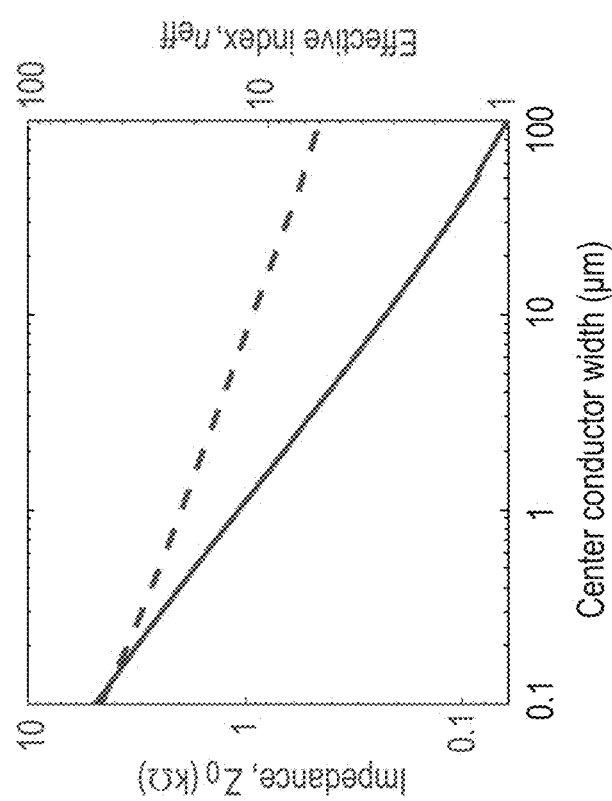
FIG. 4 is a plot of simulated characteristic impedance ($Z_0$) and effective index ($n_{eff}$) of a superconducting NbN coplanar waveguide as a function of its center conductor width.

FIG. 4 shows simulated characteristic impedance ($Z_0$) and effective index ($n_{eff}$) of the superconducting NbN coplanar waveguide. The gap size of the coplanar waveguide is fixed at 3 μm, and the NbN film has a sheet kinetic inductance of 80 pH/sq. The substrate is 300 nm $SiO_2$ on 500 μm intrinsic Si.

Figure 5:
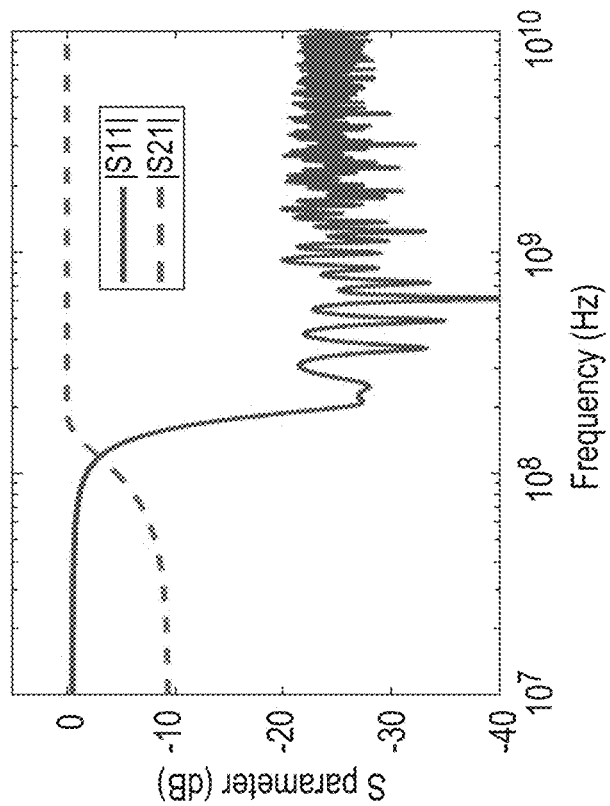
FIG. 5 is a plot of SPICE (Simulation Program with Integrated Circuit Emphasis) simulated S-parameters of the impedance taper.

FIG. 5 shows SPICE simulated S-parameters of the impedance taper. In the simulation, the taper is discretized and down-sampled to 300 sections, and each section is implemented using the LTRA model in LTspice. The taper is terminated with impedance matched resistive load on both ends.

Figure 6:
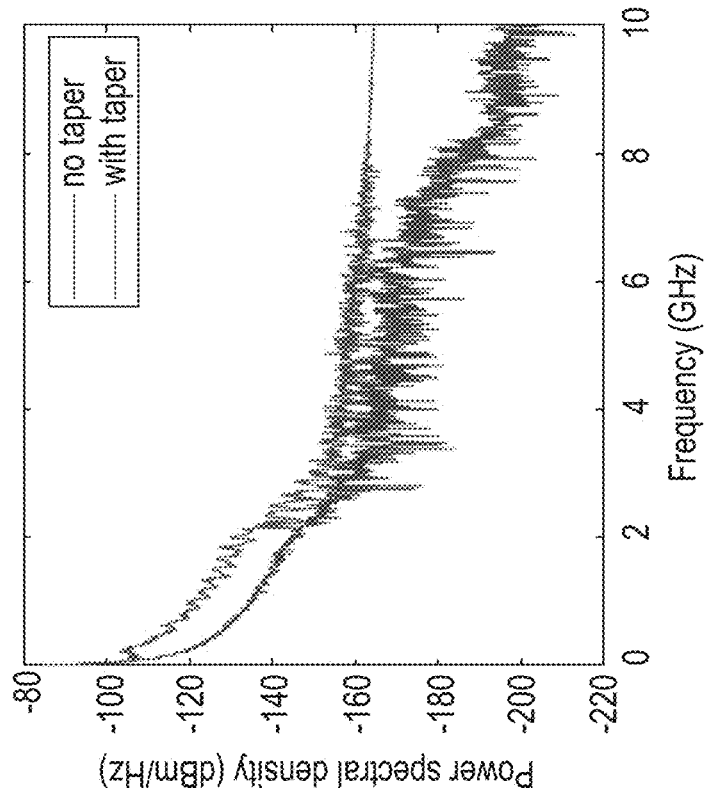
FIG. 6 is a plot of power spectral density of the output pulses from tapered and reference detectors.

FIG. 6 shows the power spectral density of the output pulses from tapered and reference detectors. The power spectral density is calculated by taking the Fourier transform of the averaged detector pulses acquired on the oscilloscope. The detector pulses are amplified through a 2.5 GHz amplifier (further details on measurement setup provided below). The sampling rate is 40 GS/s and the bandwidth is 3 GHz.

Figure 7:
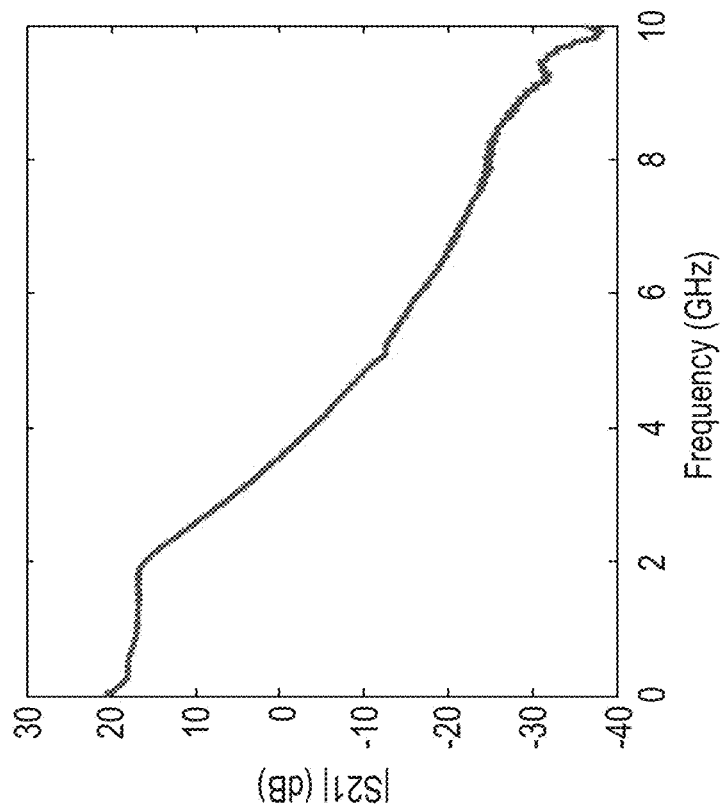
FIG. 7 is a plot illustrating system gain characterization.

FIG. 7 shows system gain characterization. The transmission coefficient (S21) is measured using a vector network analyzer (Keysight N5224A) from the device under test up to the input port of the oscilloscope, including the cryocable, bias Tee, 3 dB attenuator, and low noise amplifier (LNA2500).

Figure 8:
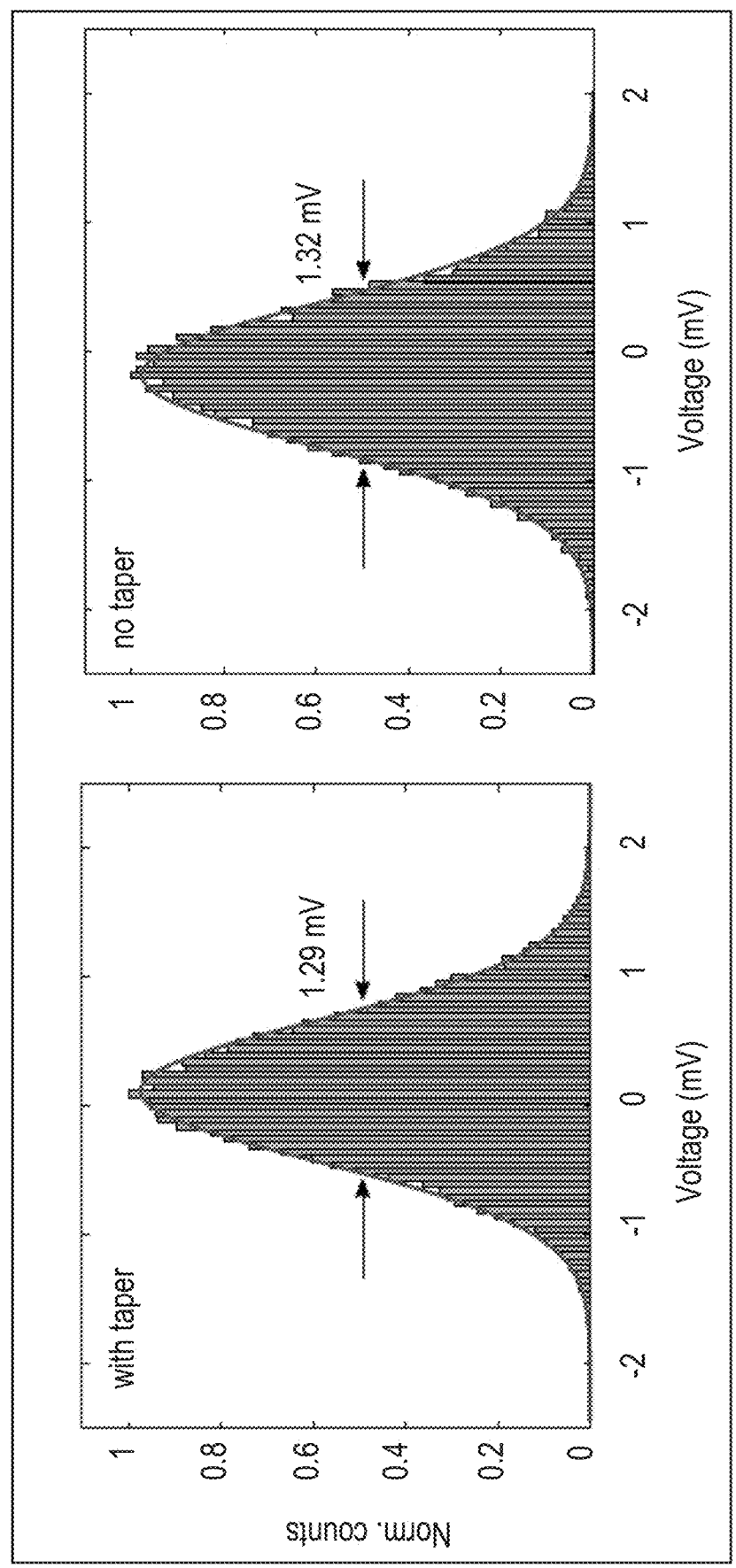
FIG. 8 shows plots illustrating measured noise floor from the tapered (left plot) and non-tapered (right plot) device.

FIG. 8 shows measured noise floor from the tapered (left plot) and non-tapered (right plot) devices. Compared to reference detector, no added noise is observed from the tapered device/detector. The noise voltage is sampled on the oscilloscope at 400 ps before the rising edge of detector pulses. The sampling rate of the oscilloscope is 40 GS/s and the bandwidth is set to 3 GHz.

Figure 9:
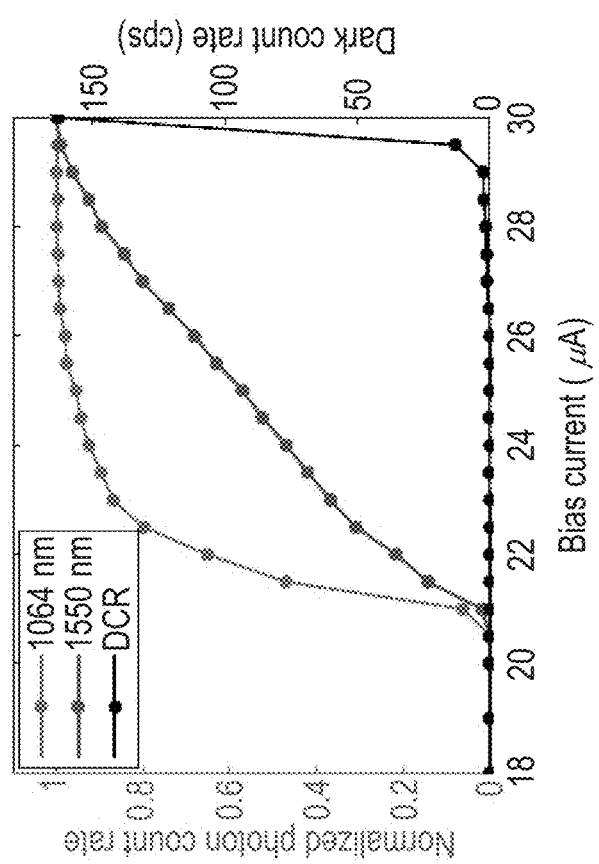
FIG. 9 shows a plot illustrating normalized photon count rate (PCR, left axis) and dark count rate (DCR, right axis) of a tapered SNSPD as a function of bias current.

FIG. 9 shows normalized photon count rate (PCR, left axis) and dark count rate (DCR, right axis) as a function of bias current. At 1064 nm, the detector shows saturated internal quantum efficiency. All the pulse shape and jitter measurement reported here were measured at a bias current of 27.5 μA.

Figure 10:
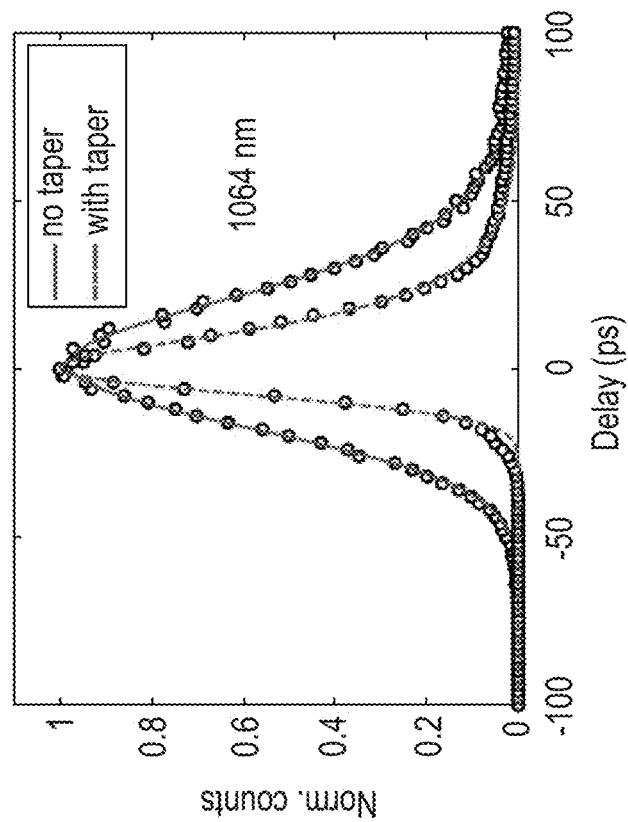
FIG. 10 is a plot illustrating the instrument response function (IRF) of a tapered and a non-tapered SPSND under 1064 nm illumination.

FIG. 10 shows instrument response function (IRF) under 1064 nm illumination. The bias current is kept at 27.5 μA. For the reference detector, σ=16.40 ps, λ=15.9 ps, FWHM=47.0 ps. For the tapered detector, σ=6.2 ps, 1/λ=12.5 ps, FWHM=22.4 ps.

Figures 11A, 11B:
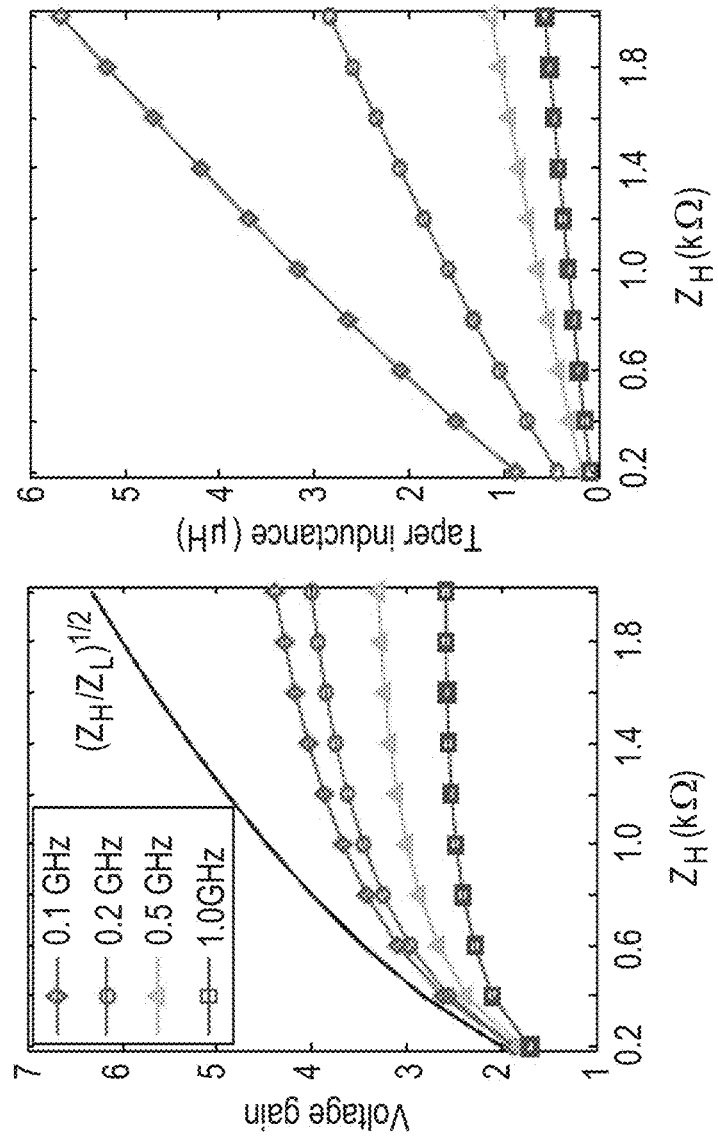
FIG. 11A is a plot illustrating simulated gain factor of a tapered SNSPD (the ratio between the maximum voltages of tapered and non-tapered detector) as a function of the starting input impedance ($Z_H$) under different nominal cut-off frequencies.
FIG. 11B is a plot illustrating taper inductance of a tapered SNSPD as a function of the starting input impedance ($Z_H$) under different nominal cut-off frequencies.

FIGS. 11A and 11B show simulated gain factor (the ratio between the maximum voltages of tapered and non-tapered detector) and taper inductance, respectively, as a function of the starting input impedance ($Z_H$) under different nominal cut-off frequencies. Higher input impedance and smaller cut-off frequencies produce higher output voltages (FIG. 11A), but result in larger inductance (FIG. 11B), and hence longer rest time. The non-tapered SNSPD has a bias current of 27.5 μA, an inductance of 414 nH, and a maximum output voltage of 1.1 mV (84% $I_B \times 50\Omega$). Each simulated taper has 300 sections and the electrical length is designed to be $l_e$=arc $\cosh(\rho_0/\rho_{pb})c/2\pi f_{co}$, where $\rho_0$=0.5 $\ln(Z_H/Z_L)$, and $\rho_{pb}$=0.1. $Z_L$ is set to 50Ω.

Example 1—Resolving Photon Numbers Using a Superconducting Tapered Nanowire Detector Time- and number-resolved photon detection is crucial for photonic quantum information processing. Existing photon-number-resolving (PNR) detectors usually have limited timing and dark-count performance or require complex fabrication and operation. Here a PNR detector is demonstrated at telecommunication wavelengths based on a single superconducting nanowire with an integrated impedance-matching taper. The detector/device was able to resolve up to five absorbed photons and had 16.1 ps timing jitter, <2 c.p.s. device dark count rate, ~86 ns reset time, and 5.6% system detection efficiency (without cavity) at 1550 nm. Its exceptional distinction between single- and two-photon responses is ideal for coincidence counting and allowed for direct observation of bunching of photon pairs from a single output port of a Hong-Ou-Mandel interferometer. This detector architecture may provide a practical solution to applications that require high timing resolution and few-photon discrimination.

Specifically, an impedance-matching technique for SNSPDs based on tapered transmission lines was developed. The taper can provide the SNSPD with a kΩ load impedance without latching while interfacing the readout electronics at 50Ω. Here, the taper is used to make the SNSPD output amplitude sensitive to the number of photon-induced hotspots, and thus enable photon number resolution. This architecture does not require multi-layer fabrication or complex readout, and offers significant advantages over array-type PNR detectors. Though the output amplitude scales sub-linearly with photon numbers, the distinction between single- and multi-photons is exceptionally large. Such a "few-photon" detector is especially important for heralding single-photon sources and improving the security of quantum cryptography.

The basic architecture and key features of the superconducting tapered nanowire detector (STaND) 1200 are summarized in FIGS. 12A-12D. The STaND 1200 includes two parts: (1) a photon-sensitive nanowire meander (similar to a conventional SNSPD) 1210, and (2) an impedance-matching taper 1220, whose characteristic impedance gradually decreases from $Z_H \approx 2.4$ kΩ on the narrow end to $Z_L$=50Ω on the wide output end 1225 (FIG. 12A, drawing not to scale; see FIGS. 15A-15B for micrographs of the device). The STaND 1200 can be represented using an equivalent circuit shown in FIG. 12B. The nanowire meander 1210 is modeled as an input photon number-dependent (i.e., can resolve multi-photon events) variable resistor $R_{HS}(n)$ in series with a kinetic inductor $L_K$, and the taper 1220 is modeled as a multi-section impedance transformer. n absorbed photons will induce n initial hotspots, which then expand through electrothermal feedback in the nanowire 1210 (FIG. 12A inset). In general, $R_{HS}(n)$ is on the order of kΩ and increases with n (but scales sub-linearly, see FIGS. 18A-18D). Following a simple division rule, the current leaving the nanowire 1210 (entering the taper 1220) scales roughly as $\sim R_{HS}(n)/(R_{HS}(n)+Z_H)$. This dependence on n becomes appreciable when $Z_H$ is comparable to $R_{HS}$, a condition that could not be achieved without the taper 1220. Moreover, the taper 1220 acts as a transformer that increases the current into the load, making the output voltage larger by as much as $\sqrt{Z_H/Z_L}$ in the case of perfect power transfer) compared to a 50Ω-loaded standard SNSPD. The picture described here does not illustrate the complex electrothermal feedback and microwave dynamics in the nanowire 1210 and taper 1220. As explained in greater detail below, the hotspot evolution and pulse shapes are simulated using a SPICE model that incorporates both these effects.

FIG. 12C compares the output waveforms from the STaND and a reference SNSPD with the same nanowire meander design on the same chip. The STaND output not only had larger amplitudes (>3.6 times) and faster slew rates (>4 times), but also exhibited level separations from multi-photon events (colored according to maximum pulse height for clear visualization). The faster slew rate reduced timing jitter from 27.4 ps full-width at half-maximum (FWHM) to 16.1 ps at 1550 nm (see FIG. 12C inset). Other than amplitude difference, the pulse shapes also observed to exhibit distinct signatures due to microwave reflections in the nanowire and taper. For example, the blue traces are separated at t=3 ns, making three- and higher-photon events distinguishable. The pulses' rise times and slew rates are processed and found to be correlated to photon numbers, which agreed with recent reports on the photon-number-dependent slew rates (see FIGS. 21A and 21B).

The multi-photon response of the STaND was probed using an attenuated 1550 nm pulsed laser. FIG. 12D shows histograms of the pulse heights at effective mean photons per pulse $\bar{\mu}$ ranging from $3.21 \times 10^{-2}$ to $1.02 \times 10^1$. Here, $\bar{\mu} = \rho\mu$, where μ is the mean photon per pulse of the coherent source, and η includes the coupling losses and detector efficiencies. Level separations up to five photons were observed. When n≥5, the levels were no longer separable, and further increasing μ only gradually shifted the peak position. The shoulders in the histograms (pulse heights <220 mV) were likely from counting events at the bends in the nanowire meander. The dark count histogram showed a more prominent shoulder because current tended to crowd in the bends and generate more dark counts (see FIG. 21). This hypothesis was further confirmed by moving the fiber focuser to illuminate more on the bends and corners, and observed more prominent shoulders (see FIG. 22).

FIGS. 13A and 13B illustrate Gaussian fits of pulse height histograms at $\bar{\mu}$=1.01 and 3.19, respectively. The separation between single- and two-photon peaks (26.4 mV) was more than 10.7 standard deviations of their spread (10.7 σ), making the STaND suitable for single-shot discrimination between single- and multi-photons. The widths of the Gaussians (5.5 mV FWHM for n=1 and >5.8 mV FWHM for n≥2) were larger than the measured electrical noise floor in the system (4.2 mV FWHM, see FIG. 20), suggesting the existence of other fluctuation mechanisms or inhomogeneities, such as variation in nanowire width, hotspot location, and photon inter-arrival time. In addition, the pulse peaks could be partially low-pass filtered and under-sampled due to the limited bandwidth of the amplifier chain and the finite resolution of the oscilloscope.

The area under each Gaussian curve was reconstructed to show the counting statistics, Q(n) (as shown in FIG. 12C). Here, Q(n≥4) was grouped as these events were not well-separated. In the STaND, since the total length of the nanowire (~500 μm) was about 1000 times longer than the hotspot size (on the order of 100 nm), the probability of hotspot overlap was negligible. Therefore, in general, Q(n) directly followed the Poisson statistics of the laser source, $S(n)=e^{-\bar{\mu}}\bar{\mu}^n/n!$, without a conditional probability, which is used in most array-type PNR detectors to account for the possibility of multiple photons hitting the same element.

FIG. 13C shows photon counting statistics reconstructed from the pulse height distributions. Q (n) is the probability of detecting an n-photon event. The measured counting statistics (symbols) directly followed the Poisson statistics of the coherent source, $S(n)=e^{-\bar{\mu}}\bar{\mu}^n/n!$ (lines).

However, the photons should overlap in time. More specifically, when the first photon is absorbed, the current in the nanowire starts to drop rapidly (80% to 20% time constant of ~200 ps, inferred from the detector rise time, see FIGS. 21A, 21B); if the second photon arrives late, it will be detected with a lower probability due to the decreased bias current. This dependence on inter-arrival time is likely why Q(n) in FIG. 12C tends to be under-estimated when n is large (the laser pulse used here had a FWHM of 33 ps). When the laser pulse width was further increased, the under-estimation became more prominent (see FIG. 25). Therefore, the STaND can resolve multiple photons within a tens of ps time window, which is acceptable and sometimes desirable for many applications.

Further presented here is the STaND's direct application in measuring non-classical states of light. When two indistinguishable photons interfere at a beam splitter, they tend to leave from the same output port (bunching), a phenomenon known as Hong-Ou-Mandel (HOM) interference. This effect is usually demonstrated using two single-photon detectors, one at each output port, and a coincidence dip between the two implies that both photons leave from the same port. Here, the STaND is used to directly observe photon bunching in HOM interference from a single output port of the beam splitter.

FIG. 14A shows the experimental setup 1400 for the HOM interference. Frequency-entangled photon pairs were generated through a spontaneous parametric down-conversion (SPDC) process and were separated using a polarizing beam splitter 1416, as explained in greater detail below. The signal photon went through a tunable air-gap delay (τ), and the idler photon polarization was rotated by 90°. The two photons then interfered at a 50:50 beam splitter 1416, and their coincidence as a function of τ was monitored at a single output port using a STaND. A comparator 1424 is used for level discrimination, which generated a pulse when the input exceeded the threshold voltage $V_{TH}$.

FIG. 14B shows the coincidence counts (300s integration time) as a function of the relative time delay τ. It shows photon bunching with interference visibility V of 98.0±3.0% (uncertainty indicates 95% confidence bound of the Gaussian fitting). V is defined as $(N_{max}-N_{min})/N_{min}$, where $N_{max/min}$ represents the maximum (minimum) coincidence counts. Here, background two-photon counts are subtracted (55±7 from the air-gap delay path and 256±16 from the polarization controller path (see polarization controller 1420) as measured by blocking individual beam path of the interferometer. These background two-photon counts were caused by imperfections in polarization controls and multi-pair events from SPDC process due to high pump power. Without subtraction, the raw coincidence had visibility of 81.4±2.8%. No two-photon dark counts (pump laser blocked) during the integration time were observed, which ensured a high signal-to-noise ratio for the measurement. The fact that high visibility HOM interference can be observed with a single detector validates the effectiveness of the photon number resolution of the STaND in practical quantum photonic applications, and such measurement can be used to characterize the indistinguishability of single-photon sources.

The detector metrics of the STaND demonstrated here include 16.1 ps FWHM timing jitter, 1.7 c.p.s. device dark count rate (26.8 c.p.s. system dark count rate, see FIG. 27), 85.8 ns reset time (estimated from the exponential decay time, 3τ, of the output pulses, see FIGS. 28A, 28B), and ~5.6% system detection efficiency at 1550 nm (see FIG. 27), all measured at 1.0 K. The system efficiency is currently limited by optical coupling and can in-principle reach >90% using the widely adopted methods of cavity integration and self-aligned fiber packaging. The reset time is limited by the taper inductance, which can be significantly reduced by using microstrip or grounded coplanar waveguide designs (see FIGS. 16A, 16B). The PNR fidelity and dynamic range may be further improved by using low-noise cryogenic amplifiers and comparators and tapers with higher input impedance. Currently, with >10σ separation between single- and multi-photon responses, the STaND is well suited as a coincidence counter. When using arrays of detectors to resolve large numbers of incident photons, an array made of such "two-photon" detectors would require ~10 times fewer elements than a click/no-click detector array (assuming unity-efficiency, see FIGS. 30A, 30B).

In summary, a new detector architecture is disclosed, STaND, whose output amplitude directly encodes photon numbers. It does not require complex fabrication or readout, and inherits the outstanding detector metrics of existing high-performance SNSPDs. STaND can become a readily accessible technology and find immediate applications, such as heralding or rejecting multi-pair generation in SPDC, characterizing single-photon emitters, and preparing and verifying non-classical states of light.

STaND device design and fabrication—The device design and fabrication followed previous work, but the taper design was modified to have a higher input impedance (2.4 KΩ) and cut-off frequency (290 MHz) for larger PNR dynamic range and faster reset. The nanowire meander was 100 nm wide and spanned an area of 11 μm×10 μm with 50% fill factor. The taper was a coplanar waveguide whose center conductor width increased from 300 nm (2.4 kΩ) to 160 μm (a fixed gap size of 3 μm), following the Klopfenstein profile. The STaND had a switching current of 25 μA at 1.0 K. The reference SNSPD compared in FIGS. 12C, 12D were fabricated on the same detector chip with same meander design as the STaND, and had a switching current of 27 μA. Measurement data were taken from a single set of STaND and reference detector. Similar results were reproduced on a different detector chip from a separate fabrication run, including the photon-number-dependent pulse amplitudes, the increase of output voltage, and the reduction of timing jitter.

HOM interference setup (see setup 1400 in FIG. 14A)— Frequency-entangled photon pairs were generated from SPDC process in a type-II phase-matched periodically-poled KTiOPO$_4$ (PPKTP) crystal 1411 pumped by an 80-MHz mode-locked, ~100 fs (FWHM 7.8 nm) Ti:sapphire laser 1410 centered at 791 nm at 90 mW. The crystal was temperature stabilized at 21.4° C. to yield frequency-degenerate signal and idler output at 1582 nm. After the pump was filtered out by a long pass filter 1412 (Semrock BLP02-1319R-25), the orthogonally-polarized signal and idler photons were coupled into a polarization-maintaining (PM) fiber 1414. The signal and idler were separated by a polarization beam splitter 1416 and recombined on a 50:50 beam splitter 1418. The polarization of signal and idler photons were made to be the same through a polarization controller, and their relative delay on the beam splitter was controlled using a tunable air gap on a translational stage (~3 dB loss). One output of the beam splitter was connected to the STaND while the other output was left unconnected. The polarization of the output photons was tuned for the maximum detector efficiency using a polarization controller 1420. The photons were coupled to the detector chip 1426 which hosts the STaND using a fiber focuser 1424 mounted on a piezo-positioner 1422. The detector's bias and readout circuits were at room temperature, and a TTL comparator 1428 was used to perform level discrimination.

Detector measurement—The STaND detectors were measured in a closed-cycle cryostat at 1.0 K. Light was coupled to the detector using a fiber focuser 1424 (1/e$^2$ diameter<10 µm), mounted on a piezo-positioner 1422 (see FIG. 14A). The detector output was amplified using room-temperature amplifiers only—an LNA2500 followed by an LNA2000 (RF Bay). Because the output of the STaND was too large and saturated the second amplifier, a 16 dB attenuator was added. The amplified detector pulses were then either captured using a 6 GHz oscilloscope (Lecroy 760Zi, 40 G samples/s sampling rate) or a universal counter (Agilent 53132A). In the HOM interference measurement, since the counter had a limited trigger level resolution (5 mV), a TTL comparator 1428 was used (PRL-350 TTL, bandwidth: 300 MHz) for level discrimination, and used a programmable battery source (SRS SIM928, 1 mV resolution) to supply the threshold voltage. A 1550 nm modulated pulsed diode laser was used (PicoQuant LDH-P-C-1550 laser head with PDL 800-B driver) to probe the multi-photon response of the STaND. The modulated laser diode was triggered at 100 kHz to avoid capacitive charging on the readout amplifier, which tends to artificially shift the pulse height. For jitter measurement shown in FIG. 12D, a 1550 nm sub-picosecond fiber-coupled mode-locked laser (Calmar FPL-02CCF) was used.

Estimation of effective mean photon number (per pulse)—The STaND can be treated as a spatially-multiplexed, N-element (N on the order of 1000), uniform-efficiency (η) detector array. As shown below, that the counting statistics of illuminating a η-efficiency detector array with µ-mean-photon coherent source is identical to that of illuminating a unity-efficiency detector array with ηµ-mean-photon coherent source. To estimate the effective mean photon $\bar{\mu}=\eta\mu$ of the pulsed laser, the optical attenuation (γ) is swept through a calibrated variable attenuator and measured the photon count rate (PCR). By fitting the detection probability (ratio between PCR and laser repetition rate $f_{rep}$) as $1-\exp(-\gamma\bar{\mu})$, $\bar{\mu}$ is extracted. This method automatically captures all losses in the measurement setup without the need for optical power measurement. Using $\bar{\mu}$ in analyzing results from coherent state illumination (FIGS. 12D, 13A-13C) helps us isolate the detector's architectural limit on PNR quality (such as sensitivity on photon inter-arrival time and probability of overlapping hotspots) from the unoptimized system efficiency.

Micrographs of the fabricated device—FIGS. 15A, 15B shows micrographs of the device presented above. FIG. 15A shows the overall device, where the taper occupies most of the footprint. Its center conductor starts with 300 nm, and gradually increases to 160 µm (50Ω). The dark outlines are the gap (3 µm). The taper size can be significantly reduced by using microstrip or grounded CPW designs. FIG. 15B shows the detail of the nanowire meander.

Reducing taper size with grounded CPW design—The taper footprint and inductance can be readily reduced by using microstrip or CPWs with closely placed top or bottom ground (grounded CPW). FIGS. 16A-16B compares the sizes of (in FIG. 16A) the CPW taper used in this work and (in FIG. 16B) a grounded CPW taper. Adding a gold ground on top of the NbN with a 120-nm-thick SiO$_2$ spacer increases the line inductance and shrinks the size of the taper. Both tapers have the same cut-off frequency (290 MHz) and initial center conductor width (300 nm). The calculated grounded CPW taper shown in FIG. 16B has a gap size of 1 µm, and a top gold ground separated by a 120 nm SiO$_2$ spacer. The substrate is Si with 300 nm thermal oxide. Adding the top ground increases the capacitance per unit length of the transmission line, which increases the effective index and reduces taper size. Both tapers follow Klopfenstein profile and have the same cut-off frequency at 290 MHz. They both start with 300 nm center conductor width, and end with 50Ω impedance. The CPW taper has a total length of 52 mm (16,600 squares). Assuming a sheet inductance of 80 pH/sq for the NbN film, the total inductance will be ~1,328 nH. The grounded CPW taper, on the other hand, only has a length of 11 mm (9118 squares) and total inductance of 729 nH. The reduced inductance will shorten the reset time of the detector. Moreover, the gold ground may serve as a mirror to form an optical cavity with a properly chosen dielectric spacing.

SPICE simulation—The STaND is simulated using a SPICE model that incorporates both the electrothermal feedback and microwave dynamics. To simulate the multi-photon response, the nanowire meander is modeled as 5 lumped SNSPDs (each with ⅕ of the total inductance) and trigger n of them simultaneously to mimic an n-photon event. FIG. 17 shows the simulation setup. The taper is formed by 300 cascaded transmission lines, each section with impedance and phase velocity set to match the actual taper profile. The SPICE model of each SNSPD is implemented based on the phenomenological hotspot velocity model.

FIGS. 18A-18D show the simulation results. Photons arrive at t=0 ns. The hotspots start to grow immediately and push current in the nanowire meander towards the taper. After ~2 ns, the current leaves the taper at the low impedance end and enters the 50Ω load (and the voltage across the 50Ω load is what is seen as output). In general, when more photons hit the nanowire, the total hotspot resistance grow faster and larger, and so does the output voltage. More photons (i.e., more initial hotspots) create output pulses with larger amplitudes and faster slew rates. However, the maximum hotspot resistance scales sub-linearly as n. The taper bandwidth, nanowire inductance, and hotspot growth rate together determine the detector output. This result is qualitatively consistent with experimental observation.

Measurement setup—FIG. 19 shows the measurement setup 1900 for characterizing the PNR capability of the STaND. A fiber-coupled pulsed diode laser 1910 was attenuated (30 dB fixed fiber attenuator 1912 in-line with a 0-100 dB calibrated variable attenuator 1914) and coupled to the detector 1920 using a fiber focuser 1918. The input polarization was adjusted via a polarization controller 1916 to maximize detection efficiency. Throughout the measurement, the detector 1920 was biased at 23 µA. The detector output was amplified using two cascaded room temperature amplifiers 1922, 1924. It was found that when the count rate was high (close to MHz, as measured with the counter 1926), the detector 1920 would charge the amplifier and the measured output drifts towards larger amplitude. To avoid this effect, the laser repetition rate is set to 100 kHz. In real detector systems where high count rate is necessary, an in-line cryogenic shunt can be added to eliminate this effect.

When measuring timing jitter of the detectors 1920, a 1550 nm mode-locked sub-ps fiber laser diode 1910 is used. Since the 16 dB attenuator was not necessary for the reference SNSPD, it was removed when measuring timing jitter for the reference SNSPD to increase its signal-to-noise ratio. The timing jitter measurements were all performed in the single-photon regime.

Electrical noise floor of the measurement system—the system's electrical noise is sampled on the oscilloscope 1926 and measured a noise floor of 4.2 mV full-width at half-maximum mV ($\sigma$=1.78 mV)(see FIG. 20). This value is smaller than the pulse amplitude distribution in FIGS. 13A, 13B. The excessive fluctuation in pulse amplitude may be due to the following factors:

(1) Variation of the nanowire widths along the wire causes different hotspot sizes, viz., wider wires generally create smaller hotspots and vice versa.

(2) Variation in the location of a detection event along the wire causes differences in microwave dynamics, viz., hotspots near the taper experience different RF reflections than the ones near the ground. This effect is particularly strong when the wire length is long, where the lumped element picture breaks down and distributed model becomes appropriate.

(3) Variation in inter-arrival time of the photons causes different hotspot evolution, viz., if the second photon is delayed relative to the first photon, it will see a reduced bias current and the hotpot growth will be slower. This effect is described in more detail in Section E below. Furthermore, even if the two photons arrive simultaneously, they may still experience different latencies depending on where they were absorbed across the width of the wire.

Rise time and rising-edge slope—In FIGS. 21A-21B, the detector pulses are processed at a range of optical attenuation (63 dB to 81 dB with 3 dB steps; 63 dB corresponded to $\mu$=5.1) and extracted their rising edge slope (slew rate) and rise time. The slope was extracted by linearly fitting the rising edge from 40% to 60% pulse amplitude, while the rise time was extracted as 20% to 80% time span. The slope roughly follows a linear correlation to the pulse amplitude, and thus can also be used to resolve photon numbers, similar to previously reported results. However, in this detector architecture, the slopes are less separable than the amplitudes. As seen in FIG. 21A, the detection events are less separable along the y-axis than along the x-axis. In FIG. 21B, the rise time is around 200 ps, and reduces slightly as photon number increases. The changes both in the slope and the rise time qualitatively follow the SPICE simulation—more photons generate detector pulses with both larger amplitude, faster slew rate and slightly shorter rise time. Pulse amplitude shows the clearest distinction among the three. For each optical attenuation, 1000 pulse traces were recorded and post-processed.

Shoulder in the pulse height histogram—FIG. 22 generally shows a comparison of pulse height distributions under different illumination condition. When the fiber focuser is driven far away from the detector (out of focus), light uniformly illuminated both the wire and bends. In this case, increased shoulder (similar to the dark count case) was observed, strongly suggesting that the shoulder originates from the bends. Specifically, a broad shoulder is observed at <220 mV. This shoulder is presumed to be from counting events at the nanowire bends, as shown in FIG. 23, where the nanowire width gradually increases. In this region, the hotspot cannot grow as large as that in the middle of the meander, and its size has a larger variation due to the range of widths in the bends. Moreover, current tends to crowd in the bends and create "hot" corners that are more likely to generate dark counts. To test this hypothesis, the fiber focuser was driven out of focus to illuminate more on the bends and observed increased shoulder that is similar to the dark count histogram, which confirms the hypothesis.

FIG. 23 generally shows geometry and current density near the bends. At the bends, the nanowire gradually increases its width. Despite the use of optimized bending curve, there are still some current-crowding effects. These areas have higher current density and are prone to generate dark counts.

Effects of photon inter-arrival time—The working principle of PNR in the STaND requires multiple photons to arrive close in time, i.e., the photon wavepacket needs to be short. Upon absorption of the first photon, the current in the nanowire starts to drop immediately. It takes about 200 ps for the current to drop to 90% (inferred from detector rise time in FIG. 21B), and the more initial hotspots, the faster the current drops (FIG. 18B). If the second photon arrives with some time delay, the nanowire will be at a lower bias current. The second photon will either create a smaller hotspot or fail to initiate a hotspot expansion at all. Therefore, if the laser pulse width is wide (e.g., more than 50 ps), higher-photon events are likely to be underestimated.

The pulse width of the modulated laser diode used can be changed by tuning the drive current. Since the STaND has a timing jitter as small as 16.1 ps, it was used to estimate the laser pulse width directly. FIG. 24 shows the measured time delay between laser sync signal and detector output when the modulated laser diode was driven at different current settings (these settings are nominal values, and the actual currents were not measured). All experiments were performed with the current setting at 2.5, which produced 33 ps wide (FWHM) pulses. When the modulated laser diode was driven at 4.0, the pulse broadened significantly ($\approx$100 ps FWHM, asymmetric with a long tail). Since the sub-ps laser has negligible pulse width (laser pulse width: 0.18 ps, spectral width: 16.18 nm, fiber dispersion: 18 ps/(nm·km), calculated pulse broadening from 2 m fiber: ~0.6 ps), the black curve represents the detector instrument response function.

When the drive current is increased ($I_d$=4.0), the pulse width increased to 100 ps (FWHM), and the measured photon statistics differed significantly from the expected Poisson statistics of the source (see FIG. 25), especially for higher photon numbers. FIG. 25 generally shows counting statistics when the modulated laser diode was driven to have a wider (≈100 ps FWHM, shown as orange curve in FIG. 24) pulse width, and that higher-photon-number events are significantly underestimated.

Calibrating the comparator readout—The comparator readout used in FIG. 14A is calibrated to find the best threshold voltage for coincidence counting. The detector is illuminated using a pulsed laser with a repetition rate of $f_{rep}$=100 kHz. FIG. 26 shows the count rate registered at the counter as a function of $V_{TH}$. The dashed lines are complementary error function (erfc) fittings of the roll-offs. The red line marks the chosen threshold voltage $V_{TH}$=259 mV for the coincidence counting. From the erfc fitting, it was found that $V_{TH}$=259 mV was 3.28σ away from the single-photon main peak (241 mV). These values differed from the ones measured using the oscilloscopes (e.g., in FIGS. 12A-12D, 13A-13C) because the comparator had limited bandwidth (300 MHz) and distorted the pulse shapes. The limited bandwidth and noise performance of the comparator had also degraded the level discrimination integrity. Nevertheless, the comparator readout was faster than post-processing and had finer threshold resolution than the counter's internal trigger settings.

Detector efficiency and dark count rate—FIG. 27A shows the normalized photon count rate (PCR) as a function of bias current. Under 1064 nm illumination, the detector showed saturated quantum efficiency; and at 1550 nm, it passed its inflection point and was close to saturation. At 23 µA with 1550 nm illumination, the STaND (11 µm×10 µm area with 50% fill-factor) had a system detection efficiency (including coupling loss up to the fiber feedthrough at the cryostat) of ≈5.6%.

FIG. 27B shows the dark count rate (DCR). When the fiber focuser was moved away, the DCR dropped by one order of magnitude, indicating that the DCR was dominated by leakage photons channeled through the fiber. At $I_B$=23 µA, the system dark count rate (fiber in focus) was 26.8 c.p.s., and the device dark count rate (fiber out of focus) as 1.7 c.p.s.

Detector reset time—the detector's reset time is estimated from the pulse decay. The reset time of the SNSPDs and STaNDs are limited by the kinetic inductance, and the output pulse follows an exponential decay exp(−t/τ), where τ=L/R. L is the total inductance of the device, including both the nanowire meander and the taper, and R=50Ω is the load impedance of the readout circuitry.

FIGS. 28A, 28B show the averaged pulse shapes of the SNSPD (FIG. 28A) and STaND (FIG. 28B). These pulses were amplified using a low-frequency amplifier (MITEQ AM-1309, gain: 50 dB, bandwidth: 1 kHz-1 GHz) because the 1 kHz lower cut-off would ensure accurate capture of the slow decay process. This amplifier was saturated and lost some high-frequency features on the rising edge, but this saturation did not affect the analysis on the falling tail. Exponential fitting of the falling tails gave the L/R time constants for the SNSPD and STaND to be 9.5 ns and 28.6 ns, respectively. With 1/(3τ) as a rule of thumb, their maximum count rates were 35.1 MHz and 11.7 MHz, respectively.

The SNSPD was designed to be 5,200 squares, and the STaND was designed to be 21,800 squares (i.e., the taper was 16,600 squares). The fitted L/R time constants did not strictly follow the ratio of the device's number of squares. This may be due to (1) the nanowire meander had larger sheet inductance due to the presence of near-switching bias current, or (2) fabrication error that led to discrepancy in device geometry.

Detector counting statistics and estimation of effective mean photon (per pulse)—It is shown, in the case of coherent state illumination, that the coupling loss and detector efficiency can be treated as an effective attenuation to the source, and the effective mean photon $\tilde{\mu}=\eta\mu$ can be estimated by fitting the photon count rate as a function of the known variable optical attenuation applied to the pulsed laser source.

A uniformly illuminated STaND can be treated as a spatially-multiplexed, N-element (N is on the order of 1,000), uniform detector array. Such a detector array is usually modeled as an N-port beam splitter, where each output port is coupled to a single-photon detector with efficiency η. For n-photon input, the probability of no-click is $P_\eta^N(0|n)=(1-\eta)^n$, and the probability of correctly getting the photon number is $$P_\eta^N(n|n) = \left(\frac{\eta}{N}\right)^n \frac{N!}{(N-n)!},$$

for n≤N. The cases in between, i.e., n photon input but detector tells k, can be solved recursively, $$P_\eta^N(k|n) = \binom{N}{k}\sum_{j=0}^{k}(-1)^j\binom{k}{j}\left[(1-\eta)+\frac{(k-j)\eta}{N}\right]^n$$

where $\binom{N}{k} = N!/[k!(N-k)!]$.

For coherent source illumination with a mean photon number of µ, the counting probability follows $$Q(k) = \sum_{n=0}^{\infty} P_\eta^N(k|n)S_\mu(n)$$

$$= \sum_{n=0}^{\infty}\binom{N}{k}\sum_{j=0}^{k}(-1)^j\binom{k}{j}\left[(1-\eta)+\frac{(k-j)\eta}{N}\right]^n\frac{e^{-\mu}\mu^n}{n!}$$

$$= \binom{N}{k}e^{\frac{\eta\mu(k-N)}{N}}(1-e^{-\frac{\eta\mu}{N}})^k,$$

where $S_\mu(n)=e^{-\mu}\mu^n/n!$ is the Poissonian photon statistics of a coherent source. Now, if a unit-efficiency detector array is illuminated using coherent source with mean photon $\tilde{\mu}=\eta\mu$, the counting probability will be $$Q'(k) = \sum_{n=0}^{\infty} P_{\eta=1}^N(k|n)S_{\tilde{\mu}}(n)$$

$$= \sum_{n=0}^{\infty}\binom{N}{k}\sum_{j=0}^{k}(-1)^j\binom{k}{j}\left[\frac{(k-j)}{N}\right]^n e^{-\tilde{\mu}}\frac{\tilde{\mu}^n}{n!}$$

$$= \binom{N}{k}e^{\frac{\tilde{\mu}(k-N)}{N}}(1-e^{-\frac{\tilde{\mu}}{N}})^k,$$

which is identical to Q(k), meaning that the counting statistics is equivalent between the two cases. Note that when N≫k, Q(k)≈$e^{-\tilde{\mu}}\tilde{\mu}^k/k!$, which is appropriate for FIG. 13B.

To estimate $\tilde{\mu}$ experimentally, the trigger level of the counter is set below the single-photon pulse amplitude and measured the photon count rate (PCR) as a function of applied optical attenuation (γ), as shown in FIG. 29. The counter threshold was set below the single-photon pulse amplitude to capture all k≥1 events. Since the clicking probability $PCR/f_{rep}$ (where PCR is the photon count rate, $f_{rep}$ is the laser repetition rate) is essentially Q(k≥1)=1−Q (k=0), it is fitted with 1−exp(−γμ) and one gets μ=10.080±0.050 at 60 dB attenuation (uncertainty indicates 95% confidence bound). The accuracy of this method was ensured by the stability of laser power and repetition rate as well as calibration of the variable optical attenuator. The use of $\tilde{\mu}$ in analyzing the measured counting statistics helped us isolate the detector's intrinsic architectural limit on PNR from external factors that could be later optimized, such as optical coupling loss and absorption efficiency.

STaND array vs. SNSPD array for photon number resolution—Similar to spatially multiplexed SNSPD arrays, it is possible to use arrays of STaNDs to resolve larger number of photons. Here the STaND is treated as a perfect two-photon detector, and compare the PNR fidelity of N-element STaND arrays against N-element click/no-click SNSPD arrays. The probability of correctly resolving an n-photon input in an N-element SNSPD array follows $P_N^{SNSPD}(n|n)=\eta''N!/[N''(N-n)!]$ for N≥n, i.e., no two-or-more photons hit the same element. For an N-element STaND array, it is desired that no three-or-more photons hit the same element. For instance, neglecting the η″ term for all cases, $P_n^{STaND}(3|3)=1-1/N^2$, $$P_N^{STaND}(4|4) = 1 - \frac{1+4(N-1)}{N^3},$$

$$P_N^{STaND}(5|5) = 1 - \frac{1+5(N-1)+10(N-1)^2}{N^4},$$

and so on (N≥ceil(n/2)). These are plotted in FIGS. 30A, 30B assuming η=1. On average, to achieve similar fidelity (e.g., 90% with η=1), one needs roughly 10 times more SNSPDs than STaNDs.

CONCLUSION

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize or be able to ascertain, using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e., "one or the other but not both") when preceded by terms of exclusivity, such as "either," "one of," "only one of," or "exactly one of" "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. A photodetector comprising:
   a biasing circuit configured to supply a bias current;
   a load in series with the biasing circuit and having a load impedance;
   a superconducting nanowire, in series with the biasing circuit and in parallel with the load, to conduct the bias current, the superconducting nanowire switching from a superconducting state to a resistive state in response to absorption of a photon wave packet, thereby diverting a portion of the bias current to the load;
   an impedance-matching taper, having a first end connected to the superconducting nanowire and a second end connected to the load, to increase a peak amplitude of an output voltage pulse on the load in response to diversion of the portion of the bias current to the load, the impedance-matching taper having an impedance greater than the load impedance at the first end and about equal to the load impedance at the second end; and
   circuitry configured to measure the peak amplitude of the output voltage on the load and correlate the peak amplitude to a number of absorbed photons in the photon wave packet.

2. The photodetector of claim 1, wherein the biasing circuit comprises a low-noise battery, a resistor, and a bias tee.

3. The photodetector of claim 1, wherein the load comprises a radio-frequency amplifier.

4. The photodetector of claim 1, wherein the load impedance is 50Ω.

5. The photodetector of claim 1, wherein the superconducting nanowire follows a meander pattern over an area of less than about 1 mm².

6. The photodetector of claim 1, wherein the superconducting nanowire follows a meander pattern over an area of less than about 100 µm².

7. The photodetector of claim 1, wherein the superconducting nanowire is fabricated in a superconducting thin film and the impedance-matching taper comprises a transmission line formed of the superconducting thin film.

8. The photodetector of claim 1, wherein the superconducting nanowire is disposed within an optical cavity.

9. The photodetector of claim 1, wherein a resistance of the superconducting nanowire in the resistive state is proportional to a number of photons n in the photon wave packet.

10. The photodetector of claim 9, wherein the resistance of the superconducting nanowire in the resistive state is configured to vary sublinearly with the number of photons n in the photon wave packet.

11. The photodetector of claim 1, wherein the impedance-matching taper is configured to load the superconducting nanowire without latching.

12. The photodetector of claim 1, wherein the impedance-matching taper is configured to reflect microwave signals to prevent latching.

13. The photodetector of claim 1, wherein the impedance-matching taper is a grounded co-planar waveguide.

14. The photodetector of claim 1, wherein the impedance at the first end of the impedance-matching taper is at least 1 kΩ.

15. The photodetector of claim 1, wherein the impedance-matching taper is configured to increase a sensitivity of the output voltage on the load to a variation of a resistance of the superconducting nanowire in the resistive state due to different photon numbers.

16. The photodetector of claim 1, wherein the impedance taper is configured to increase the peak amplitude of the output voltage on the load.

17. The photodetector of claim 1, wherein the circuitry comprises a discriminator configured to correlate the peak amplitude with a number of absorbed photons in the photon wave packet.

18. A method of detecting a photon wave packet, the method comprising:
   running a bias current through a superconducting nanowire in parallel with a load;
   absorbing the photon wave packet with the superconducting nanowire, absorption of the photon wave packet diverting a portion of the bias current to the load via an impedance-matching taper;
   measuring a peak amplitude of an output voltage pulse across the load caused by diversion of the portion of the bias current to the load; and
   determining a number of photons in the photon wave packet based on the peak amplitude of the output voltage pulse.

* * * * *